(12) United States Patent
Hattori et al.

(10) Patent No.: US 11,374,130 B2
(45) Date of Patent: Jun. 28, 2022

(54) SEMICONDUCTOR DEVICE AND SEMICONDUCTOR MEMORY DEVICE

(71) Applicant: Kioxia Corporation, Tokyo (JP)

(72) Inventors: Shigeki Hattori, Kawasaki Kanagawa (JP); Tomomasa Ueda, Yokohama Kanagawa (JP); Keiji Ikeda, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 114 days.

(21) Appl. No.: 17/001,208

(22) Filed: Aug. 24, 2020

(65) Prior Publication Data

US 2021/0249540 A1    Aug. 12, 2021

(30) Foreign Application Priority Data

Feb. 7, 2020    (JP) .............................. JP2020-019361

(51) Int. Cl.
*H01L 29/10* (2006.01)
*H01L 29/786* (2006.01)
(Continued)

(52) U.S. Cl.
CPC .. *H01L 29/78693* (2013.01); *H01L 27/10805* (2013.01); *H01L 27/124* (2013.01);
(Continued)

(58) Field of Classification Search
CPC ........... H01L 27/10805; H01L 27/1225; H01L 27/1255; H01L 27/124; H01L 29/247; H01L 29/78618; H01L 29/78693
(Continued)

(56) References Cited

U.S. PATENT DOCUMENTS 9,698,272 B1    7/2017  Ikeda
9,780,170 B2   10/2017  Ota
(Continued)

FOREIGN PATENT DOCUMENTS

JP    2010-074061 A     4/2010
JP       6006055 B2    10/2016
(Continued)

OTHER PUBLICATIONS

U.S. Appl. No. 16/809,199, filed Mar. 4, 2020, Hattori.
(Continued)

*Primary Examiner* — Tan N Tran
(74) *Attorney, Agent, or Firm* — Foley & Lardner LLP

(57) ABSTRACT

A semiconductor device of an embodiment includes: a first oxide semiconductor layer including a first region, a second region, and a third region between the first region and the second region; a gate electrode; a gate insulating layer provided between the third region and the gate electrode; a first electrode electrically connected to the first region; a second electrode electrically connected to the second region; and a second oxide semiconductor layer provided in at least one of a position between the first region and the first electrode and a position between the second region and the second electrode and containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less.

16 Claims, 16 Drawing Sheets

(51) Int. Cl.
*H01L 27/108* (2006.01)
*H01L 27/12* (2006.01)
*H01L 29/24* (2006.01)

(52) U.S. Cl.
CPC ...... *H01L 27/1225* (2013.01); *H01L 27/1255* (2013.01); *H01L 29/247* (2013.01); *H01L 29/78618* (2013.01)

(58) Field of Classification Search
USPC .............................................. 257/43, 59, 72
See application file for complete search history.

(56) References Cited

U.S. PATENT DOCUMENTS

| | | | |
|---|---|---|---|
| 9,905,695 B2* | 2/2018 | Hanaoka | ................ H01L 29/24 |
| 10,074,748 B2 | 9/2018 | Matsubayashi et al. | |
| 10,096,721 B2 | 10/2018 | Yamazaki et al. | |
| 2010/0295042 A1 | 11/2010 | Yano et al. | |
| 2011/0121288 A1 | 5/2011 | Yamazaki et al. | |
| 2012/0319113 A1 | 12/2012 | Yamazaki | |
| 2013/0099227 A1 | 4/2013 | Nakagawa et al. | |
| 2014/0197408 A1 | 7/2014 | Tsuruma | |
| 2015/0155289 A1 | 6/2015 | Inoue et al. | |
| 2016/0240682 A1 | 8/2016 | Shimomura et al. | |
| 2020/0381557 A1 | 12/2020 | Hattori et al. | |

FOREIGN PATENT DOCUMENTS

| | | |
|---|---|---|
| JP | 6188712 B2 | 8/2017 |
| JP | 2017-168623 A | 9/2017 |
| JP | 2017-183739 A | 10/2017 |
| JP | 6231880 B2 | 11/2017 |
| JP | 6400536 B2 | 10/2018 |
| JP | 2020-198343 A | 12/2020 |
| TW | 2016-40675 A | 11/2016 |
| TW | 201732947 A | 9/2017 |
| WO | WO-2009/093625 A1 | 7/2009 |
| WO | WO-2012/173108 A1 | 12/2012 |
| WO | WO-2013/021632 A1 | 2/2013 |

OTHER PUBLICATIONS

Non-Final Office Action on U.S. Appl. No. 16/809,199 dated Jul. 26, 2021.
Park et al., "Effect of Aluminum addition to solution-derived amorphous indium zinc oxide thin film for an oxide thin film transistors", Microelectronic Engineering, 109 (2013) pp. 189-192.
Final Office Action on U.S. Appl. No. 16/809,199 dated Feb. 7, 2022.

\* cited by examiner

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2020-019361, filed on Feb. 7, 2020, the entire contents of which are incorporated herein by reference.

FIELD

Embodiments described herein relate generally to a semiconductor device and a semiconductor memory device.

BACKGROUND

An oxide semiconductor transistor which forms a channel in an oxide semiconductor layer has an excellent characteristic that a channel leakage current during an off operation is extremely small. For this reason, for example, the application of the oxide semiconductor transistor to a switching transistor of a memory cell of dynamic random-access memory (DRAM) has been studied.

For example, when the oxide semiconductor transistor is applied to the switching transistor of the memory cell, the oxide semiconductor transistor undergoes heat treatment accompanying the formation of the memory cell and wiring. It has thus been expected to realize an oxide semiconductor transistor having high heat resistance with little variation in characteristics even after heat treatment.

DETAILED DESCRIPTION

Figure 1:
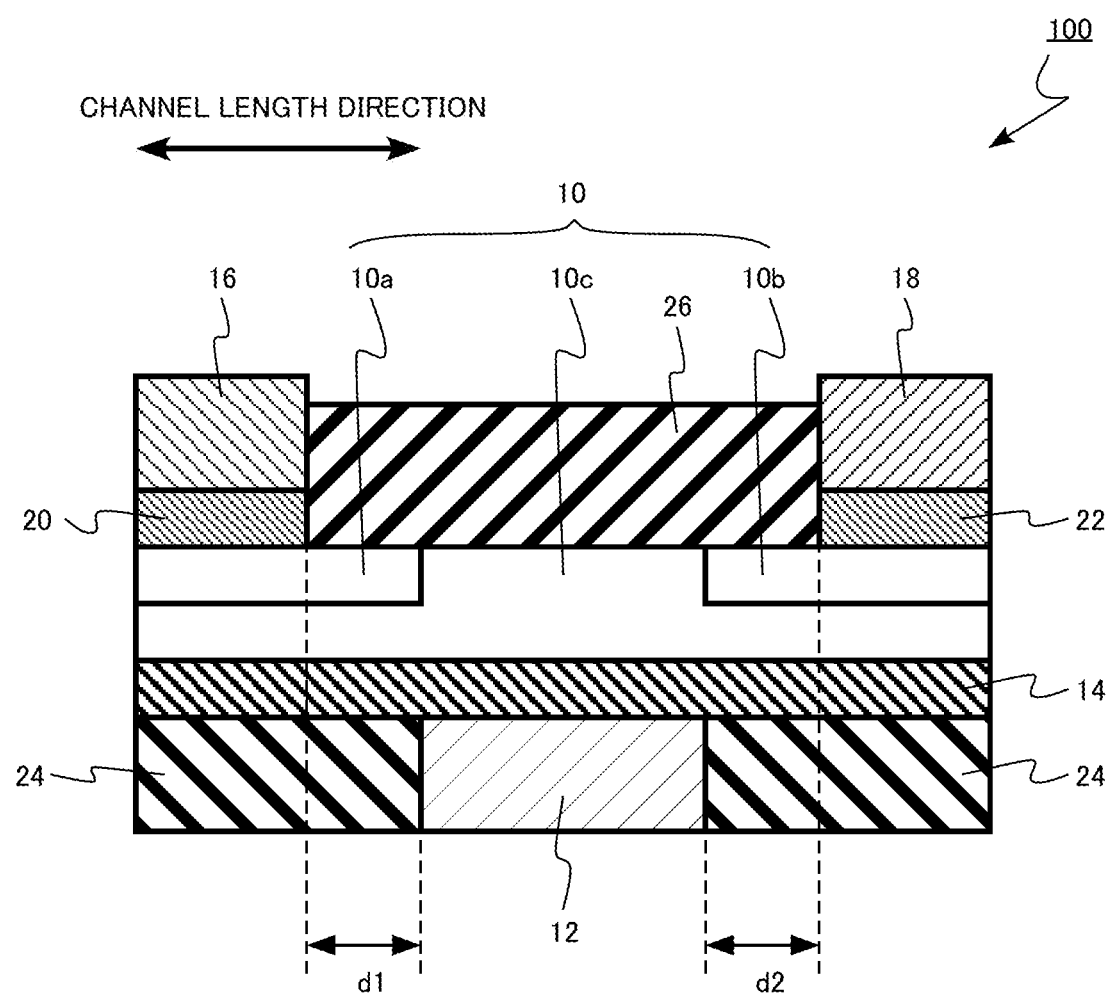
FIG. 1 is a schematic sectional view of a semiconductor device according to a first embodiment.

A semiconductor device of an embodiment includes: a first oxide semiconductor layer including a first region, a second region, and a third region between the first region and the second region; a gate electrode; a gate insulating layer provided between the third region and the gate electrode; a first electrode electrically connected to the first region; a second electrode electrically connected to the second region; and a second oxide semiconductor layer provided in at least one of a position between the first region and the first electrode and a position between the second region and the second electrode, the second oxide semiconductor layer containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less.

Embodiments of the present disclosure will be described below with reference to the drawings. In the following description, the same or similar members or the like are denoted by the same reference numerals, and the description of the once described member or the like is omitted appropriately.

In the present specification, the term "above" or "below" may be used for convenience. The term "above" or "below" is merely a term indicating a relative positional relationship in the drawing and is not a term defining a positional relationship with respect to gravity.

The qualitative analysis and quantitative analysis of the chemical composition of the members constituting the semiconductor device and the semiconductor memory device described in the present specification can be performed by, for example, secondary Ion mass spectrometry (SIMS), energy-dispersive X-ray spectroscopy (EDX), and rutherford back-scattering spectrometry (RBS). A transmission electron microscope (TEM), for example, can be used for measuring the thickness of each of the members constituting the semiconductor device and the distance between the members.

First Embodiment

A semiconductor device of a first embodiment includes: a first oxide semiconductor layer including a first region, a second region, and a third region between the first region and the second region; a gate electrode; a gate insulating layer provided between the third region and the gate electrode; a first electrode electrically connected to the first region; a second electrode electrically connected to the second region; and a second oxide semiconductor layer provided in at least one of a position between the first region and the first electrode and a position between the second region and the second electrode, the second oxide semiconductor layer containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less.

FIG. 1 is a schematic sectional view of the semiconductor device of the first embodiment.

The semiconductor device of the first embodiment is a transistor 100. The transistor 100 is an oxide semiconductor transistor in which a channel is formed in the oxide semiconductor layer. The transistor 100 is a so-called bottom gate type transistor having a gate electrode provided below the oxide semiconductor layer in which the channel is formed, and having a source electrode and a drain electrode provided above the oxide semiconductor layer.

The transistor 100 includes a first oxide semiconductor layer 10, a gate electrode 12, a gate insulating layer 14, a source electrode 16, a drain electrode 18, a second oxide semiconductor layer 20, a third oxide semiconductor layer 22, a first insulating layer 24, and a second insulating layer 26. The source electrode 16 is an example of the first electrode. The drain electrode 18 is an example of the second electrode.

The first oxide semiconductor layer 10 has a first region 10a, a second region 10b, and a third region 10c.

A channel serving as a current path is formed in the first oxide semiconductor layer 10 when the transistor 100 is turned on. A direction in which electrons flow in the channel is called a channel length direction. The channel length direction is indicated by a double-headed arrow in FIG. 1. The channel length direction is a direction from the source electrode 16 towards the drain electrode 18.

The first oxide semiconductor layer 10 is an oxide semiconductor. The first oxide semiconductor layer 10 is a metal oxide. The first oxide semiconductor layer 10 is amorphous, for example.

The first oxide semiconductor layer 10 contains, for example, indium (In), gallium (Ga), and zinc (Zn). The atomic ratio of the sum of indium, gallium, and zinc in metal elements contained in the first oxide semiconductor layer 10 is, for example, 90% or more. The atomic ratio of the sum of indium, gallium, and zinc in elements except for oxygen contained in the first oxide semiconductor layer 10 is, for example, 90% or more. For example, in the first oxide semiconductor layer 10, there is no element except for oxygen having an atomic ratio larger than any one of indium, gallium, and zinc.

The first oxide semiconductor layer 10 has a first region 10a, a second region 10b, and a third region 10c. At least a part of the third region 10c is provided between the first region 10a and the second region 10b.

The first region 10a functions as a source region of the transistor 100, and the second region 10b functions as a drain region of the transistor 100. A channel is formed in the third region 10c when the transistor 100 is turned on.

The first region 10a and the second region 10b are, for example, n-type semiconductors. The oxygen-vacancy concentration of the first region 10a and the oxygen-vacancy concentration of the second region 10b are higher than the oxygen-vacancy concentration of the third region 10c, for example. The oxygen-vacancy in the first oxide semiconductor layer 10 functions as a donor.

The n-type carrier concentration in the first region 10a and the n-type carrier concentration in the second region 10b are higher than the n-type carrier concentration in the third region 10c, for example. The electric resistance of the first region 10a and the electric resistance of the second region 10b are lower than the electric resistance of the third region 10c, for example.

The thickness of the first oxide semiconductor layer 10 is, for example, 10 nm or more and 100 nm or less.

The first oxide semiconductor layer 10 is formed by, for example, an atomic layer deposition method (ALD method).

The gate electrode 12 is provided below the first oxide semiconductor layer 10. The gate electrode 12 is, for example, a metal, a metal compound, or a semiconductor. The gate electrode 12 is, for example, tungsten (W). The gate length of the gate electrode 12 is, for example, 20 nm or more and 100 nm or less.

The gate insulating layer 14 is provided between the first oxide semiconductor layer 10 and the gate electrode 12. The gate insulating layer 14 is provided between the third region 10c and the gate electrode 12.

The gate insulating layer 14 is, for example, an oxide or oxynitride. The gate insulating layer 14 is, for example, silicon oxide or aluminum oxide. The thickness of the gate insulating layer 14 is, for example, 2 nm or more and 10 nm or less.

An oxide layer (not shown) of a material different from that of the gate insulating layer 14 may be provided between the first oxide semiconductor layer 10 and the gate insulating layer 14.

The source electrode 16 is provided above the first oxide semiconductor layer 10. The first oxide semiconductor layer 10 is sandwiched between the gate electrode 12 and the source electrode 16.

The source electrode 16 is provided above the first region 10a. The source electrode 16 is electrically connected to the first region 10a.

The source electrode 16 is, for example, a metal or a metal compound. The source electrode 16 is, for example, tungsten (W).

The drain electrode 18 is provided above the first oxide semiconductor layer 10. The first oxide semiconductor layer 10 is sandwiched between the gate electrode 12 and the drain electrode 18.

The drain electrode 18 is provided above the second region 10b. The drain electrode 18 is electrically connected to the second region 10b.

The drain electrode 18 is, for example, a metal or a metal compound. The source electrode 16 is, for example, tungsten (W).

The second oxide semiconductor layer 20 is provided between the first oxide semiconductor layer 10 and the source electrode 16. The second oxide semiconductor layer 20 is provided between the first region 10a and the source electrode 16. The second oxide semiconductor layer 20 is in contact with the first oxide semiconductor layer 10.

The second oxide semiconductor layer 20 is an oxide semiconductor. The second oxide semiconductor layer 20 is a metal oxide. The second oxide semiconductor layer 20 is amorphous, for example.

The second oxide semiconductor layer 20 contains indium (In), aluminum (Al), and zinc (Zn). The second oxide semiconductor layer 20 is an oxide containing indium (In), aluminum (Al), and zinc (Zn).

The atomic ratio of aluminum to the sum of indium, aluminum, and zinc in the second oxide semiconductor layer 20 is 8% or more and 23% or less. That is, the atomic ratio expressed by Al/(In+Al+Zn) of the second oxide semiconductor layer 20 is 8% or more and 23% or less.

The atomic ratio of indium to the sum of indium, aluminum, and zinc in the second oxide semiconductor layer 20 is 45% or less. That is, the atomic ratio expressed by In/(In+Al+Zn) of the second oxide semiconductor layer 20 is 45% or less.

The atomic ratio of indium to the sum of indium, aluminum, and zinc in the second oxide semiconductor layer 20 is, for example, 1% or more. That is, the atomic ratio expressed by In/(In+Al+Zn) of the second oxide semiconductor layer 20 is 1% or more.

The atomic ratio of the sum of indium, aluminum, and zinc in metal elements contained in the second oxide semiconductor layer 20 is, for example, 90% or more. The atomic ratio of the sum of indium, aluminum, and zinc in the elements except for oxygen contained in the second oxide semiconductor layer 20 is, for example, 90% or more. For example, in the second oxide semiconductor layer 20, there is no element except for oxygen having an atomic ratio larger than any one of indium, aluminum, and zinc.

The atomic ratio of each of gallium (Ga), tin (Sn), and titanium (Ti) in the metal elements contained in the second oxide semiconductor layer 20 is less than 10%, for example.

The third oxide semiconductor layer 22 is provided between the first oxide semiconductor layer 10 and the drain electrode 18. The third oxide semiconductor layer 22 is provided between the second region 10b and the drain electrode 18. The third oxide semiconductor layer 22 is in contact with the first oxide semiconductor layer 10.

The third oxide semiconductor layer 22 is an oxide semiconductor. The third oxide semiconductor layer 22 is a metal oxide. The third oxide semiconductor layer 22 is amorphous, for example.

The third oxide semiconductor layer 22 contains indium (In), aluminum (Al), and zinc (Zn). The third oxide semiconductor layer 22 is an oxide containing indium (In), aluminum (Al), and zinc (Zn).

The atomic ratio of aluminum to the sum of indium, aluminum, and zinc in the third oxide semiconductor layer 22 is 8% or more and 23% or less. That is, the atomic ratio expressed by Al/(In+Al+Zn) is 8% or more and 23% or less.

The atomic ratio of indium to the sum of indium, aluminum, and zinc in the third oxide semiconductor layer 22 is 45% or less. That is, the atomic ratio expressed by In/(In+Al+Zn) of the third oxide semiconductor layer 22 is 45% or less.

The atomic ratio of indium to the sum of indium, aluminum, and zinc in the third oxide semiconductor layer 22 is, for example, 1% or more. That is, the atomic ratio expressed by In/(In+Al+Zn) of the third oxide semiconductor layer 22 is 1% or more.

The atomic ratio of the sum of indium, aluminum, and zinc in metal elements contained in the third oxide semiconductor layer 22 is, for example, 90% or more. The atomic ratio of the sum of indium, aluminum, and zinc in the elements except for oxygen contained in the third oxide semiconductor layer 22 is, for example, 90% or more. For example, in the third oxide semiconductor layer 22, there is no element except for oxygen having an atomic ratio larger than any one of indium, aluminum, and zinc.

The atomic ratio of each of gallium (Ga), tin (Sn), and titanium (Ti) in the metal elements contained in the third oxide semiconductor layer 22 is less than 10%, for example.

Figure 2:
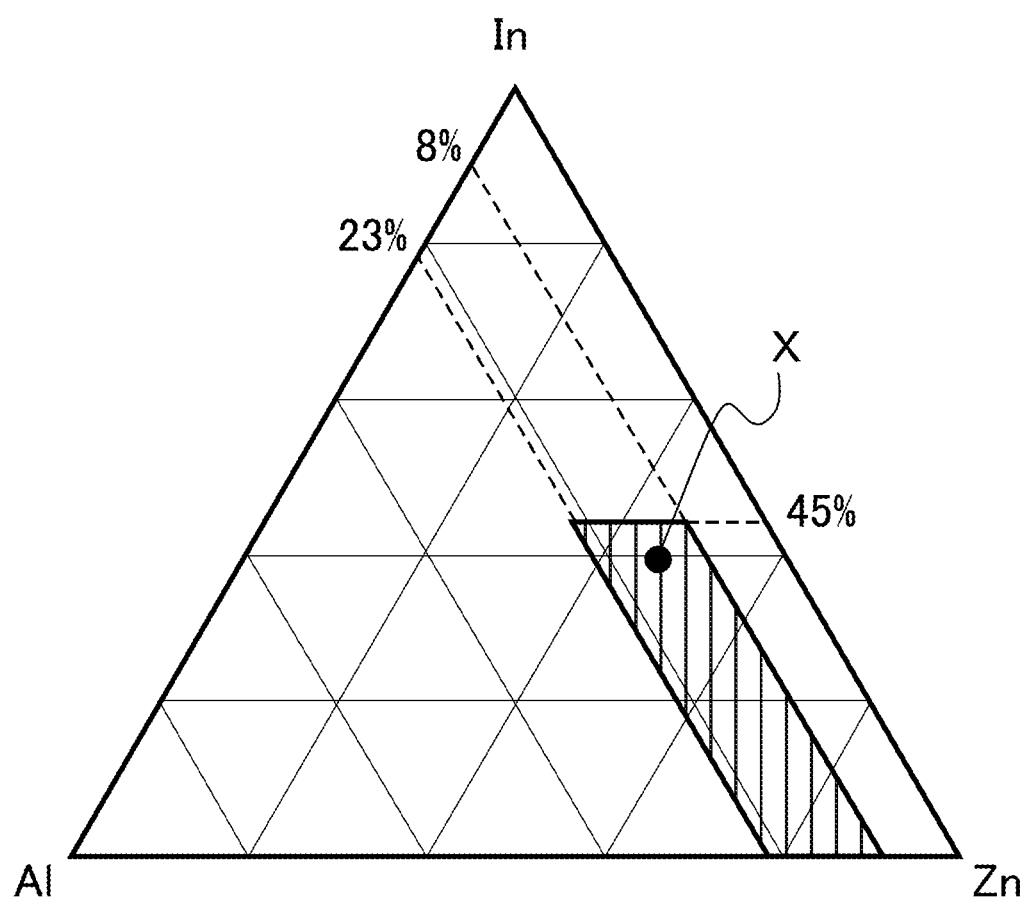
FIG. 2 is a diagram showing a chemical composition range of a second oxide semiconductor layer and a third oxide semiconductor layer of the semiconductor device according to the first embodiment.

FIG. 2 is a diagram showing a chemical composition range of the second oxide semiconductor layer and the third oxide semiconductor layer in the semiconductor device of the first embodiment. FIG. 2 is a triangular diagram. A hatched region in FIG. 2 is the chemical composition range of the second oxide semiconductor layer 20 and the third oxide semiconductor layer 22.

In the hatched region of FIG. 2, the atomic ratio of aluminum to the sum of indium, aluminum, and zinc is 8% or more and 23% or less. That is, the atomic ratio expressed by Al/(In+Al+Zn) is 8% or more and 23% or less. In the hatched region of FIG. 2, the atomic ratio of indium to the sum of indium, aluminum, and zinc is 45% or less. That is, the atomic ratio expressed by In/(In+Al+Zn) is 45% or less.

The distance between the gate electrode 12 and the source electrode 16 in the channel length direction (d1 in FIG. 1) and the distance between the gate electrode 12 and the drain electrode 18 in the channel length direction (d2 in FIG. 1) are each referred to as a gate offset distance. The gate offset distance d1 is, for example, 30 nm or more. The gate offset distance d2 is, for example, 30 nm or more.

The first insulating layer 24 is provided below the first oxide semiconductor layer 10. The first insulating layer 24 is, for example, an oxide, a nitride, or an oxynitride. The first insulating layer 24 is, for example, silicon oxide, silicon nitride, or silicon oxynitride.

The second insulating layer 26 is provided on the first oxide semiconductor layer 10. The second insulating layer 26 is provided between the source electrode 16 and the drain electrode 18.

The second insulating layer 26 electrically separates the source electrode 16 and the drain electrode 18 from each other. In the second insulating layer 26, the second insulating layer 26 is, for example, an oxide, a nitride, or an oxynitride. The second insulating layer 26 is, for example, silicon oxide, silicon nitride, or silicon oxynitride.

Hereinafter, the function and effect of the semiconductor device of the first embodiment will be described.

Figure 3:
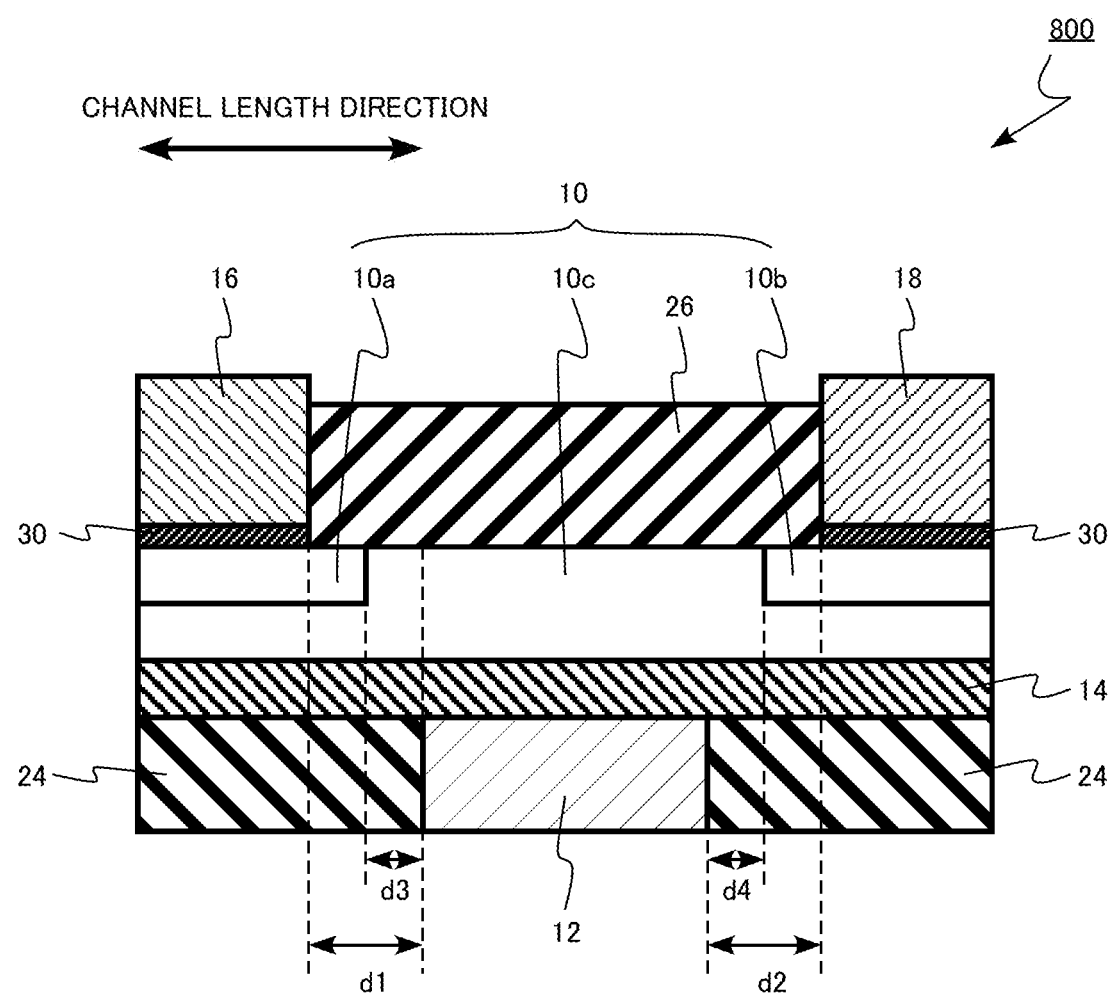
FIG. 3 is a schematic sectional view of a semiconductor device according to a comparative example.

FIG. 3 is a schematic sectional view of a semiconductor device according to a comparative example. The semiconductor device of the comparative example is a transistor 800. The transistor 800 is an oxide semiconductor transistor in which a channel is formed in an oxide semiconductor. The transistor 800 is a so-called bottom gate type transistor having a gate electrode provided below the oxide semiconductor layer in which the channel is formed, and having a source electrode and a drain electrode provided above the oxide semiconductor layer.

The transistor 800 includes a first oxide semiconductor layer 10, a gate electrode 12, a gate insulating layer 14, a source electrode 16, a drain electrode 18, a first insulating layer 24, a second insulating layer 26, and a metal oxide layer 30. The source electrode 16 is an example of the first electrode. The drain electrode 18 is an example of the second electrode.

The first oxide semiconductor layer 10 has a first region 10a, a second region 10b, and a third region 10c.

The transistor 800 differs from the transistor 100 of the first embodiment in not including the second oxide semiconductor layer 20 or the third oxide semiconductor layer 22. Transistor 800 differs from transistor 100 of the first embodiment in including the metal oxide layer 30.

The metal oxide layer 30 is formed by heat treatment applied onto the first oxide semiconductor layer 10 after the formation of the source electrode 16 and the drain electrode 18. Specifically, oxygen contained in the first oxide semiconductor layer 10 is absorbed by the source electrode 16 and the drain electrode 18, and the metal constituting each of the source electrode 16 and the drain electrode 18 is oxidized, to form the metal oxide layer 30.

The formation of the metal oxide layer 30 increases the contact resistance between the first oxide semiconductor layer 10 and the source electrode 16 and the contact resistance between the first oxide semiconductor layer 10 and the drain electrode 18. This causes a problem of an increase in the parasitic resistance of the transistor 800 and a decrease in the on-current of the transistor 800.

The first region 10*a* and the second region 10*b* of the first oxide semiconductor layer 10 are formed by absorbing oxygen in the source electrode 16 and the drain electrode 18 by heat treatment applied after the formation of the source electrode 16 and the drain electrode 18. That is, oxygen contained in the first oxide semiconductor layer 10 is absorbed by the source electrode 16 and the drain electrode 18, whereby oxygen-vacancy is generated in the first oxide semiconductor layer 10. The generation of the oxygen-vacancy leads to the formation of the first region 10*a* and the second region 10*b* having high n-type carrier concentration and low resistance.

The first region 10*a* is laterally extended from the source electrode 16 toward the gate electrode 18 by heat treatment. The second region 10*b* is laterally extended from the drain electrode 18 toward the gate electrode 18 by heat treatment.

In the transistor 800, the distance between the first region 10*a* and the second region 10*b* is a channel length. The shorter the distance between the first region 10*a* and the second region 10*b*, the shorter the channel length of the transistor 800. When the channel length of the transistor 800 becomes excessively short, the threshold voltage of the transistor 800 decreases and a leakage current increases, which is undesirable.

Therefore, a predetermined gate offset distance d1 is preferably provided between the gate electrode 12 and the source electrode 16. A predetermined gate offset distance d2 is preferably provided between the gate electrode 12 and the drain electrode 18.

When the amounts of oxygen absorbed by the source electrode 16 and the drain electrode 18 are small, the amounts of elongation of the first region 10*a* and the second region 10*b* in the channel length direction decrease. Thereby, the distance (d3 in FIG. 3) between the gate electrode 12 and the first region 10*a* increases. Further, the distance (d4 in FIG. 3) between the gate electrode 12 and the second region 10*b* increases.

The increase in the separation distance d3 and the separation distance d4 leads to an increase in the parasitic resistance of the transistor 800. This thus causes the problem of the decrease in the on-current of the transistor 800.

The transistor 100 of the first embodiment includes the second oxide semiconductor layer 20 between the first oxide semiconductor layer 10 and the source electrode 16, and includes the third oxide semiconductor layer 22 between the first oxide semiconductor layer 10 and the drain electrode 18. The provision of the second oxide semiconductor layer 20 and the third oxide semiconductor layer 22 prevents the oxidation of the source electrode 16 and the drain electrode 18.

Therefore, the provision of the second oxide semiconductor layer 20 and the third oxide semiconductor layer 22 prevents an increase in contact resistance between the first oxide semiconductor layer 10 and the source electrode 16 and an increase in contact resistance between the first oxide semiconductor layer 10 and the drain electrode 18. Hence the reduction in the on-current of the transistor 100 is prevented.

Figure 4:
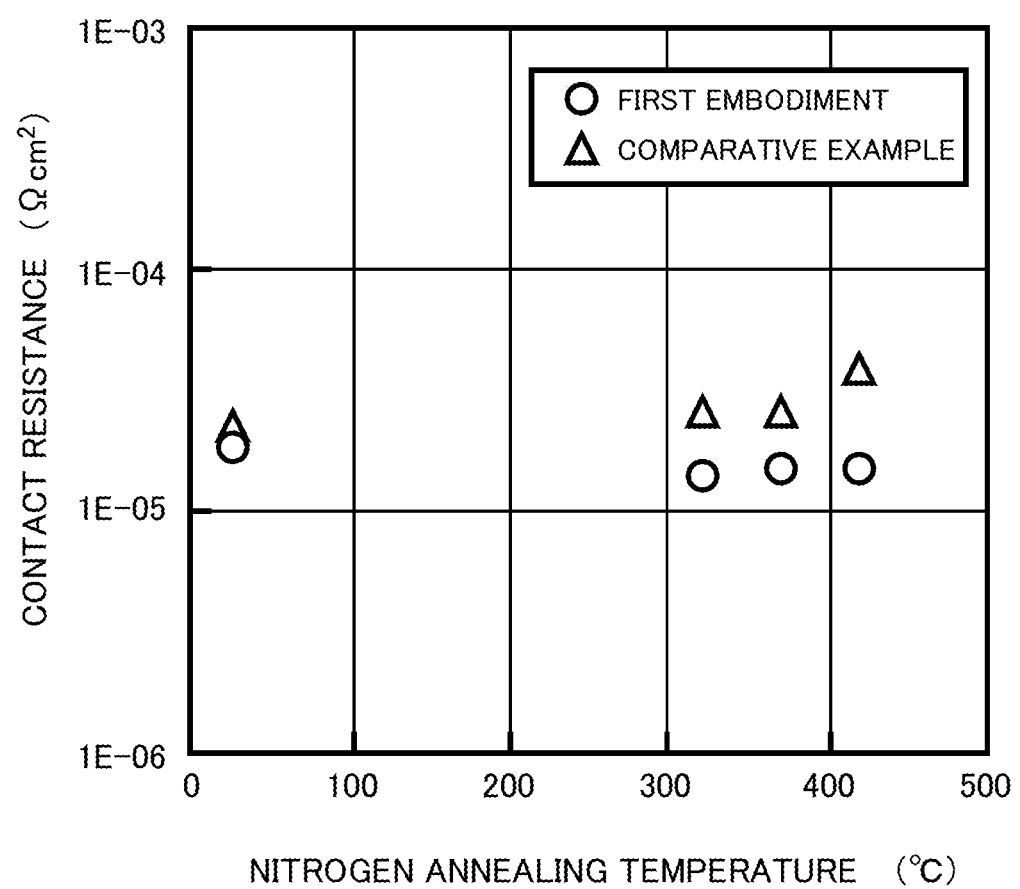
FIG. 4 is an explanatory diagram of the function and effect of the semiconductor device according to the first embodiment.

FIG. 4 is an explanatory diagram of the function and effect of the semiconductor device according to the first embodiment. FIG. 4 is a diagram showing the relationship between the nitrogen annealing temperature and the contact resistance after the formation of the transistor. In the figure, a circle indicates the case of the first embodiment, and a triangle indicates the case of the comparative example.

As the chemical composition of the second oxide semiconductor layer 20 and the third oxide semiconductor layer 22 in the case of the first embodiment, a chemical composition at point X in FIG. 2 is used.

As shown in FIG. 4, in the case of the comparative example, the contact resistance is increased by nitrogen annealing at 400° C. or higher. On the other hand, in the case of the first embodiment, no change is seen in the contact resistance even when nitrogen annealing is performed at 400° C. or higher. Therefore, in the transistor 100 of the first embodiment, there is no increase in the contact resistance even when heat treatment is applied, and the transistor 100 has high heat resistance.

The transistor 100 of the first embodiment includes the second oxide semiconductor layer 20 between the first oxide semiconductor layer 10 and the source electrode 16, and includes the third oxide semiconductor layer 22 between the first oxide semiconductor layer 10 and the drain electrode 18. The provision of the second oxide semiconductor layer 20 and the third oxide semiconductor layer 22 increases the amounts of elongation of the first region 10*a* and the second region 10*b* in the channel length direction. Hence the distance between the gate electrode 12 and the first region 10*a* is reduced. Further, the distance between the gate electrode 12 and the second region 10*b* is reduced.

Due to the reduction in the distance, the parasitic resistance of the transistor 100 is reduced. This prevents a reduction in the on-current of the transistor 100 of the first embodiment.

Figure 5:
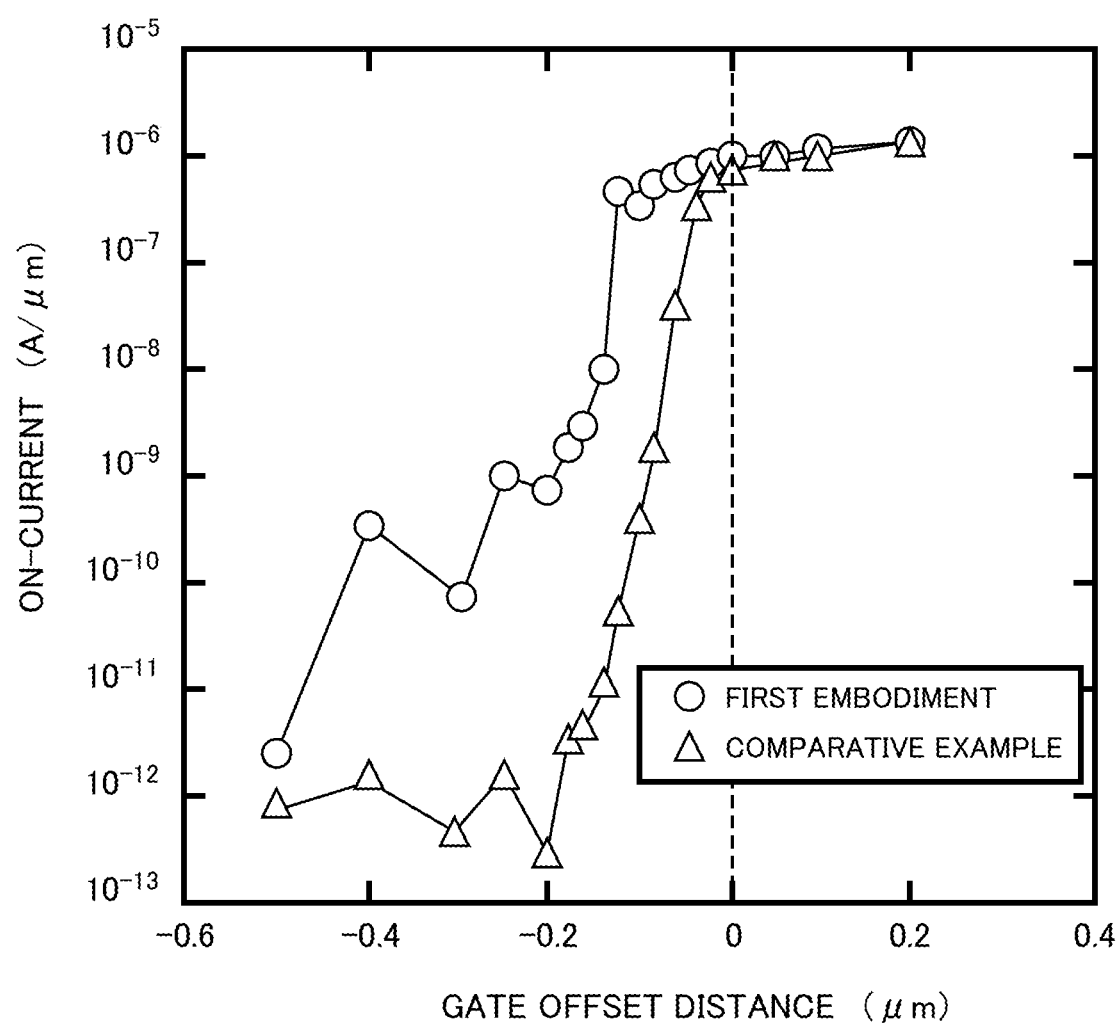
FIG. 5 is an explanatory diagram of the function and effect of the semiconductor device according to the first embodiment.

FIG. 5 is an explanatory diagram of the function and effect of the semiconductor device according to the first embodiment. FIG. 5 shows the on-current of the transistor when the gate offset distance of the transistor is changed. In the figure, a circle indicates the case of the first embodiment, and a triangle indicates the case of the comparative example.

As the chemical composition of the second oxide semiconductor layer 20 and the third oxide semiconductor layer 22 in the case of the first embodiment, a chemical composition at point X in FIG. 2 is used.

The on-current of the transistor is measured after nitrogen annealing is performed at 320° C. after the formation of the transistor. A case where the gate offset distance is negative shows a case where the gate electrode 12 and the source electrode 16, or the gate electrode 12 and the drain electrode 18, are separated without overlapping in the channel length direction.

As is apparent from FIG. 5, when the comparison is made at the same gate offset distance, the on-current is reduced in the first embodiment as compared with the comparative example. This is considered to be because in the case of the first embodiment, the amounts of elongation of the first region 10*a* and the second region 10*b* in the channel length direction are larger and the parasitic resistance of the transistor is reduced.

The atomic ratio of aluminum to the sum of indium, aluminum, and zinc in the second oxide semiconductor layer 20 and the third oxide semiconductor layer 22 is 8% or more and 23% or less. The atomic ratio of indium to the sum of indium, aluminum and zinc is 45% or less.

The metal oxide in the chemical composition range has low oxygen permeability. Since the metal oxide in the chemical composition range has low oxygen permeability, the oxidation of the source electrode 16 and the drain electrode 18 can be prevented by sandwiching the metal oxide between the first oxide semiconductor layer 10 and the source electrode 16 and between the first oxide semiconductor layer 10 and the drain electrode 18.

In particular, by setting the atomic ratio of indium to the sum of indium, aluminum, and zinc in the second oxide semiconductor layer 20 and the third oxide semiconductor layer 22 to 45% or less, crystallization of the metal oxide constituting the second oxide semiconductor layer 20 and the third oxide semiconductor layer 22 is prevented. The prevention of the crystallization of the metal oxide leads to a decrease in the permeability of oxygen.

The metal oxide in the chemical composition range has a high oxygen absorption capacity. Since having a high oxygen absorption capacity, the metal oxide in the chemical composition range absorbs a large amount of oxygen from the first oxide semiconductor layer 10. This increases the amounts of elongation of the first region 10a and the second region 10b in the channel length direction.

From the viewpoint of making the oxygen permeability low and the oxygen absorption capacity high, the atomic ratio of indium to the sum of indium, aluminum, and zinc is preferably 1% or more, and more preferably 35% or more, in the second oxide semiconductor layer 20 and the third oxide semiconductor layer 22.

From the viewpoint of facilitating the manufacture of the transistor 100, the distance between the gate electrode 12 and the source electrode 16 and the distance between the gate electrode 12 and the drain electrode 18 are preferably 30 nm or more.

As described above, according to the first embodiment, an oxide semiconductor transistor having high heat resistance, in which an increase in contact resistance after heat treatment is prevented, is achieved. Further, according to the first embodiment, an oxide semiconductor transistor having a low parasitic resistance is achieved.

Second Embodiment

A semiconductor device of a second embodiment differs from the semiconductor device of the first embodiment in that the first oxide semiconductor layer contains indium (In), aluminum (Al), and zinc (Zn), the atomic ratio of aluminum to a sum of indium, aluminum, and zinc is 8% or more and 23% or less, and the atomic ratio of indium to the sum of indium, aluminum, and zinc is 70% or less. Hereinafter, a part of the description of contents overlapping with those of the first embodiment will be omitted.

Figure 6:
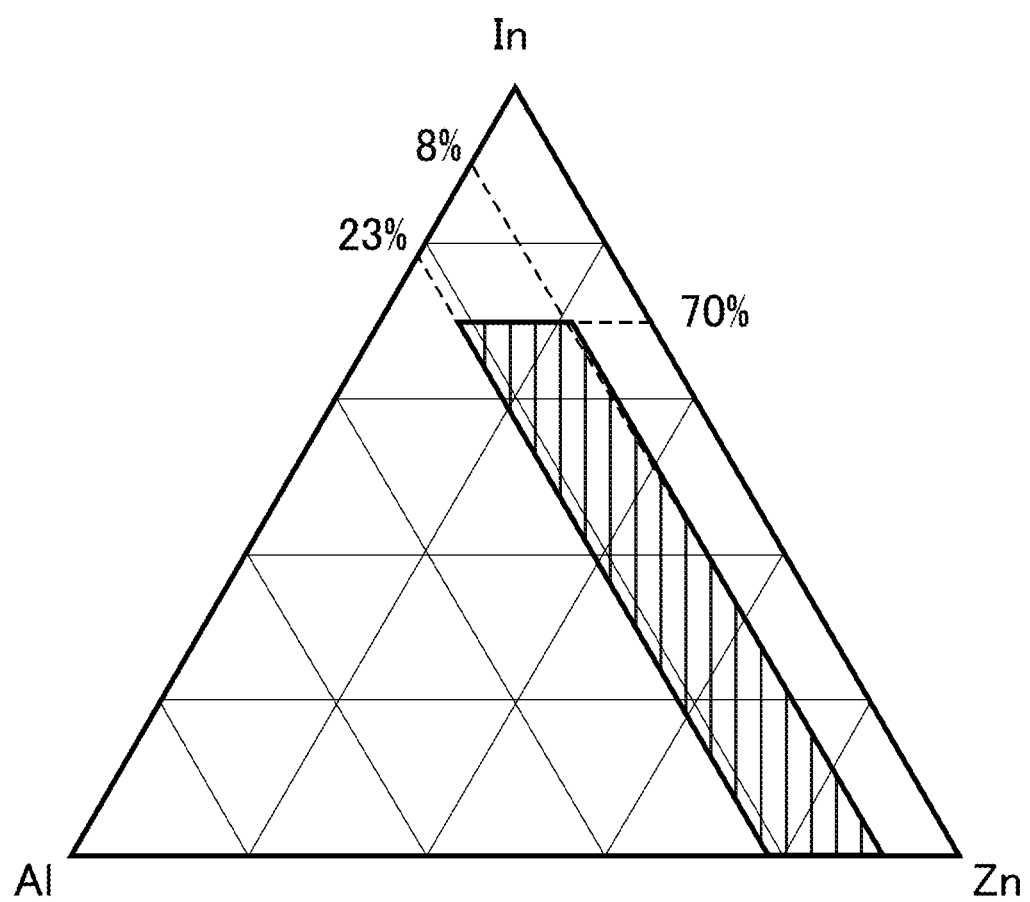
FIG. 6 is a diagram showing a chemical composition range of a first oxide semiconductor layer of a semiconductor device according to a second embodiment.

FIG. 6 is a diagram showing a chemical composition range of the first oxide semiconductor layer in the semiconductor device of the second embodiment. FIG. 6 is a triangular diagram. A hatched region of FIG. 6 is the chemical composition range of the first oxide semiconductor layer 10.

The first oxide semiconductor layer 10 of the transistor of the second embodiment contains indium (In), aluminum (Al), and zinc (Zn), and the atomic ratio of aluminum to the sum of indium, aluminum, and zinc is 8% or more and 23% or less. That is, the atomic ratio expressed by Al/(In+Al+Zn) is 8% or more and 23% or less. In the hatched region of FIG. 6, the atomic ratio of indium to the sum of indium, aluminum, and zinc is 70% or less. That is, the atomic ratio expressed by In/(In+Al+Zn) is 70% or less.

The chemical composition of the first oxide semiconductor layer 10 differs from the chemical compositions of the second oxide semiconductor layer 20 and the third oxide semiconductor layer 22.

The atomic ratio of the sum of indium, aluminum, and zinc in metal elements contained in the first oxide semiconductor layer 10 is, for example, 90% or more. The atomic ratio of the sum of indium, aluminum, and zinc in the elements except for oxygen contained in the first oxide semiconductor layer 10 is, for example, 90% or more. For example, in the first oxide semiconductor layer 10, there is no element except for oxygen having an atomic ratio larger than any one of indium, aluminum, and zinc.

The atomic ratio of each of gallium (Ga), tin (Sn), and titanium (Ti) in the metal elements contained in the first oxide semiconductor layer 10 is less than 10%, for example.

By applying heat treatment after the formation of the oxide semiconductor transistor, for example, the threshold voltage may vary. It is conceivable that the variation of the threshold voltage occurs when oxygen in the metal oxide constituting the oxide semiconductor layer in which the channel is formed dissociates from the metal element. In other words, it is considered that the variation of the threshold voltage occurs due to the formation of oxygen-vacancy in the metal oxide constituting the oxide semiconductor layer in which the channel is formed. It is expected to achieve an oxide semiconductor transistor having high heat resistance with little variation in threshold voltage even after heat treatment.

When the metal oxide in the chemical composition range shown in FIG. 6 is applied to the first oxide semiconductor layer 10, it is possible to achieve an oxide semiconductor transistor having high heat resistance with little variation in threshold voltage even after heat treatment. Further, it is possible to achieve an oxide semiconductor transistor having high mobility.

From the viewpoint of improving the heat resistance of the transistor, the atomic ratio of aluminum to the sum of indium, aluminum, and zinc in the first oxide semiconductor layer 10 is preferably 10% or more and 20% or less, and more preferably 11% or more and 15% or less.

From the viewpoint of improving the mobility of the transistor, the atomic ratio of indium to the sum of indium, aluminum, and zinc contained in the first oxide semiconductor layer 10 is preferably 39% or more. From the viewpoint of improving the mobility of the transistor, the atomic ratio of indium to the sum of indium, aluminum, and zinc contained in the first oxide semiconductor layer 10 is preferably larger than the atomic ratios of indium to the sum of indium, aluminum, and zinc contained in the second oxide semiconductor layer 20 and the third oxide semiconductor layer 22.

From the viewpoint of crystallizing the first oxide semiconductor layer 10 and stabilizing the characteristics of the transistor, the atomic ratio of indium to the sum of indium, aluminum, and zinc contained in the first oxide semiconductor layer 10 is preferably 45% or less, and more preferably 41% or less.

According to the second embodiment, as in the first embodiment, an oxide semiconductor transistor having high heat resistance, in which an increase in contact resistance after heat treatment is prevented, is achieved. As in the first embodiment, an oxide semiconductor transistor having a low parasitic resistance is achieved. Further, an oxide semiconductor transistor having high heat resistance, in which the variation in threshold voltage after heat treatment is prevented, is achieved. Further, an oxide semiconductor transistor having high mobility is achieved.

Third Embodiment

A semiconductor device of a third embodiment differs from the semiconductor device of the first embodiment in that the gate electrode is disposed above the first oxide semiconductor layer. Hereinafter, a part of the description of contents overlapping with those of the first embodiment will be omitted.

Figure 7:
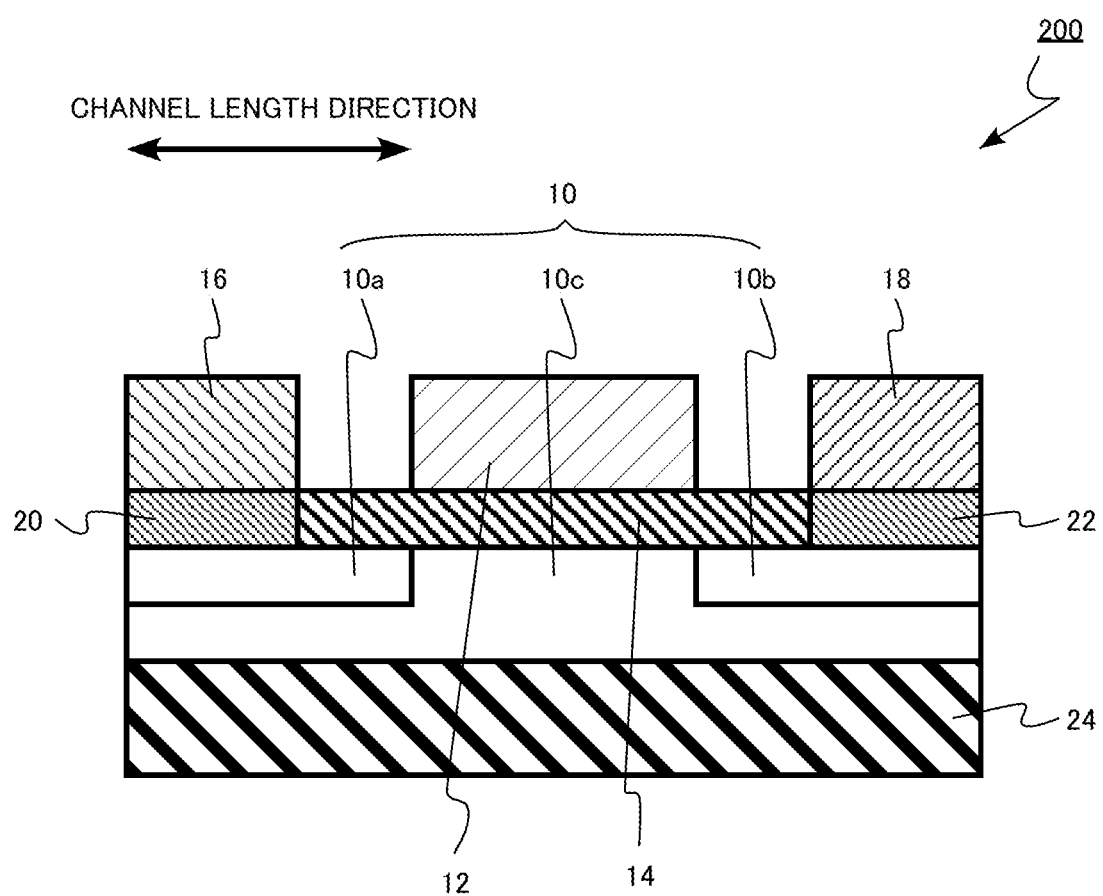
FIG. 7 is a schematic sectional view of a semiconductor device according to a third embodiment.

FIG. 7 is a schematic sectional view of the semiconductor device of the third embodiment.

The semiconductor device of the third embodiment is a transistor 200. The transistor 200 is an oxide semiconductor transistor in which a channel is formed in an oxide semiconductor layer. The transistor 200 is a so-called top gate type transistor having a gate electrode, a source electrode, and a drain electrode provided above the oxide semiconductor layer in which the channel is formed.

The transistor 200 includes a first oxide semiconductor layer 10, a gate electrode 12, a gate insulating layer 14, a source electrode 16, a drain electrode 18, a second oxide semiconductor layer 20, a third oxide semiconductor layer 22, and a first insulating layer 24. The source electrode 16 is an example of the first electrode. The drain electrode 18 is an example of the second electrode.

The first oxide semiconductor layer 10 has a first region 10a, a second region 10b, and a third region 10c.

According to the third embodiment, as in the first embodiment, an oxide semiconductor transistor having high heat resistance, in which an increase in contact resistance after heat treatment is prevented, is achieved. As in the first embodiment, an oxide semiconductor transistor having a low parasitic resistance is achieved.

Fourth Embodiment

A semiconductor device of a fourth embodiment differs from the semiconductor device of the first embodiment in that the gate electrode surrounds the first oxide semiconductor layer. Hereinafter, a part of the description of contents overlapping with those of the first embodiment will be omitted.

Figure 8:
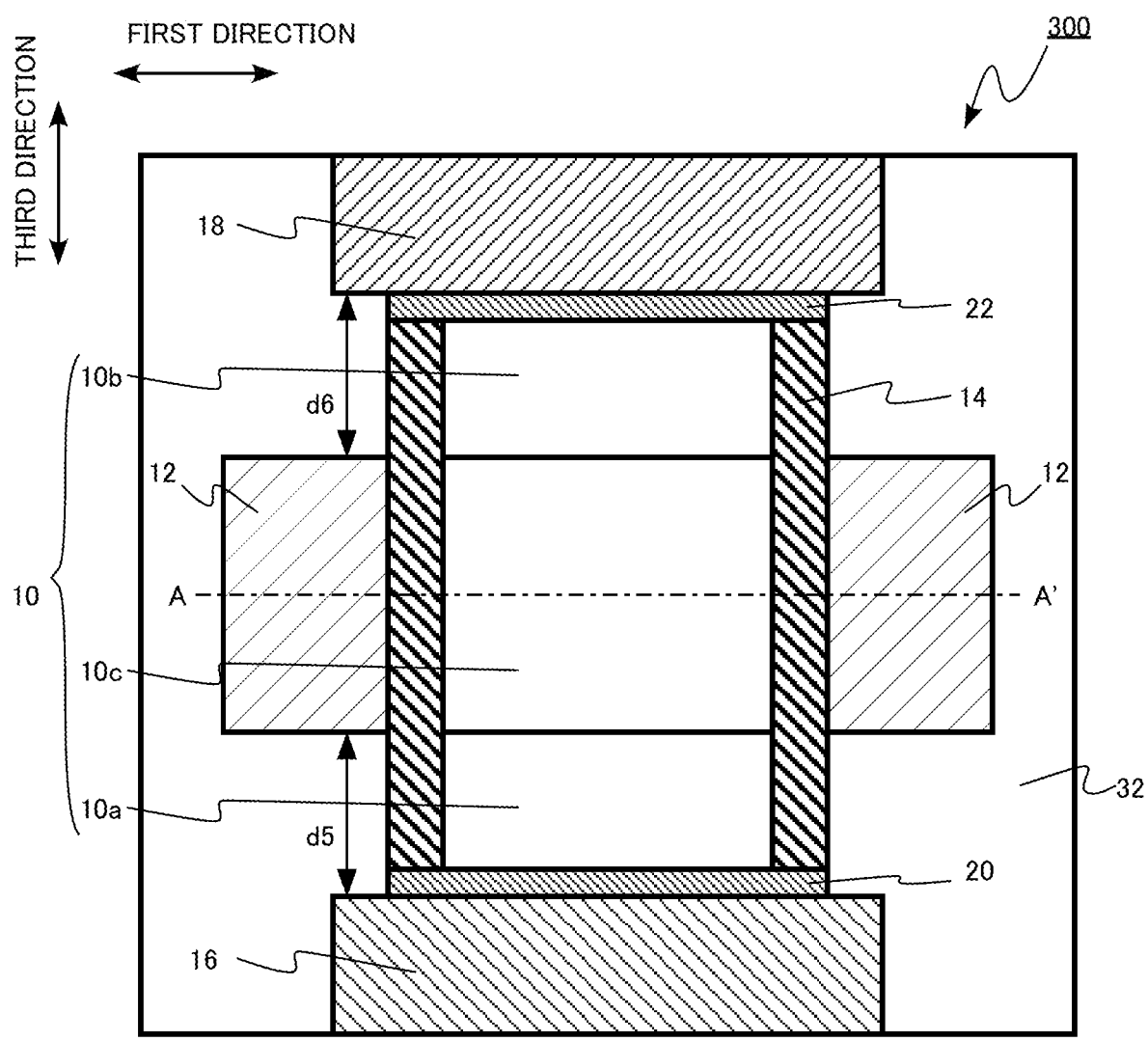
FIG. 8 is a schematic sectional view of a semiconductor device according to a fourth embodiment.
Figure 9:
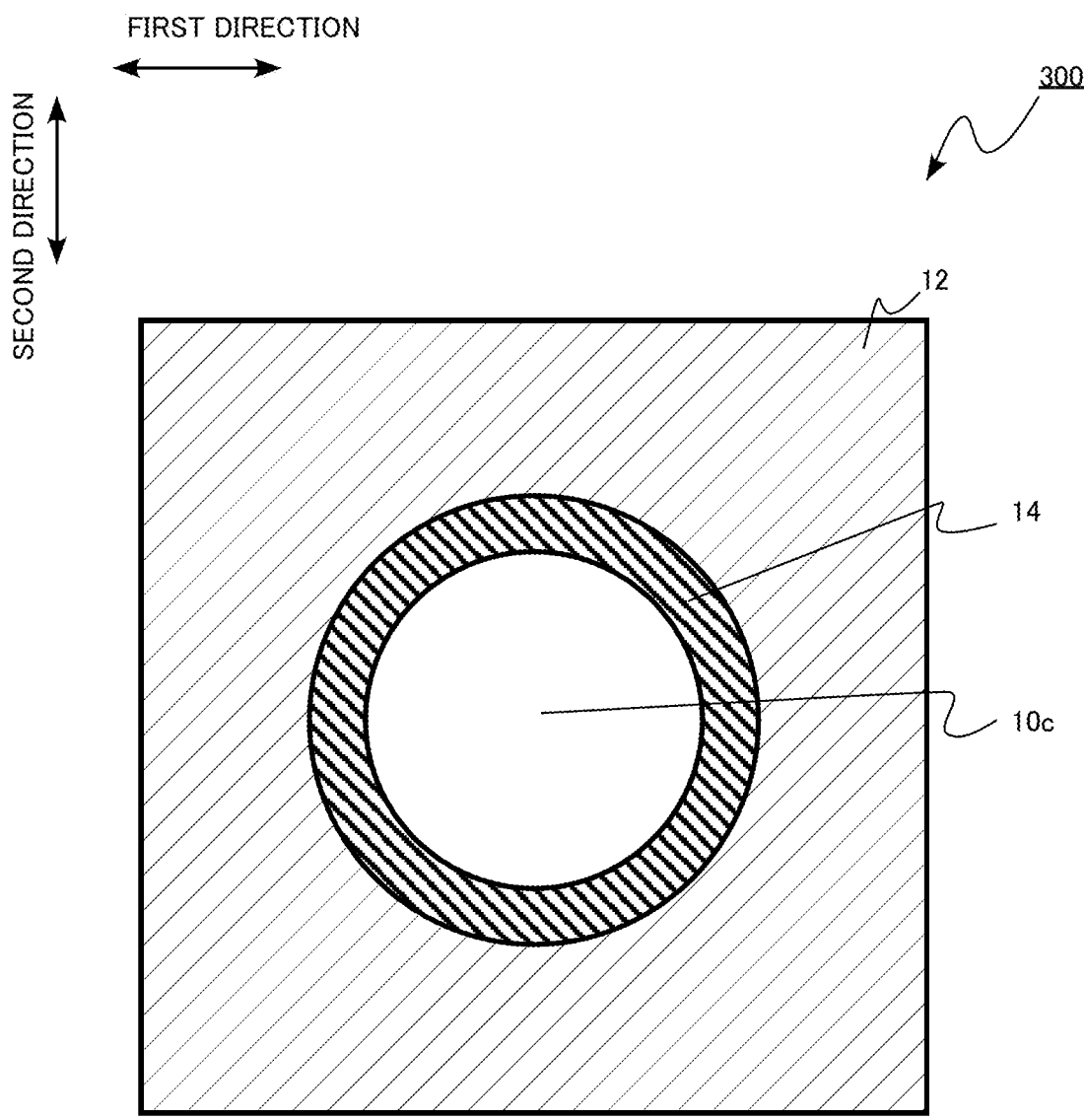
FIG. 9 is a schematic sectional view of the semiconductor device according to the fourth embodiment.

FIGS. 8 and 9 are schematic sectional views of the semiconductor device of the fourth embodiment. FIG. 9 is a sectional view taken along line AA' of FIG. 8. In FIG. 8, the horizontal direction is referred to as a first direction, the depth direction is referred to as a second direction, and the vertical direction is referred to as a third direction.

The semiconductor device of the fourth embodiment is a transistor 300. The transistor 300 is an oxide semiconductor transistor in which a channel is formed in an oxide semiconductor. The transistor 300 is a so-called surrounding gate transistor (SGT) with a gate electrode provided surrounding an oxide semiconductor layer in which a channel is formed. The transistor 300 is a so-called vertical transistor.

The transistor 300 includes a first oxide semiconductor layer 10, a gate electrode 12, a gate insulating layer 14, a source electrode 16, a drain electrode 18, a second oxide semiconductor layer 20, a third oxide semiconductor layer 22, and an interlayer insulating layer 32. The source electrode 16 is an example of the first electrode. The drain electrode 18 is an example of the second electrode.

The first oxide semiconductor layer 10 has a first region 10a, a second region 10b, and a third region 10c.

The first oxide semiconductor layer 10 is provided between the source electrode 16 and the drain electrode 18. A channel serving as a current path is formed in the first oxide semiconductor layer 10 when the transistor 300 is turned on. The first oxide semiconductor layer 10 extends in the third direction. The first oxide semiconductor layer 10 has a columnar shape extending in the third direction. The first oxide semiconductor layer 10 has, for example, a cylindrical shape.

A direction in which electrons flow in the channel is called a channel length direction. The third direction is the channel length direction of the transistor 300.

The first oxide semiconductor layer 10 is an oxide semiconductor. The first oxide semiconductor layer 10 is a metal oxide. The first oxide semiconductor layer 10 is amorphous, for example.

The first oxide semiconductor layer 10 contains, for example, indium (In), gallium (Ga), and zinc (Zn). The atomic ratio of the sum of indium, gallium, and zinc in metal elements contained in the first oxide semiconductor layer 10 is, for example, 90% or more. The atomic ratio of the sum of indium, gallium, and zinc in elements except for oxygen contained in the first oxide semiconductor layer 10 is, for example, 90% or more. For example, in the first oxide semiconductor layer 10, there is no element except for oxygen having an atomic ratio larger than any one of indium, gallium, and zinc.

The first oxide semiconductor layer 10 has a first region 10a, a second region 10b, and a third region 10c. The third region 10c is provided between the first region 10a and the second region 10b.

The first region 10a functions as a source region of the transistor 300, and the second region 10b functions as a drain region of the transistor 300. A channel is formed in the third region 10c when the transistor 300 is turned on.

The first region 10a and the second region 10b are, for example, n-type semiconductors. The oxygen-vacancy concentration of the first region 10a and the oxygen-vacancy concentration of the second region 10b are higher than the oxygen-vacancy concentration of the third region 10c, for example. The oxygen-vacancy in the first oxide semiconductor layer 10 functions as a donor.

The n-type carrier concentration in the first region 10a and the n-type carrier concentration in the second region 10b are higher than the n-type carrier concentration in the third region 10c, for example. The electric resistance of the first region 10a and the electric resistance of the second region 10b are lower than the electric resistance of the third region 10c, for example.

The width of the first oxide semiconductor layer 10 in the first direction is, for example, 20 nm or more and 100 nm or less. The length of the first oxide semiconductor layer 10 in the third direction is, for example, 80 nm or more and 200 nm or less.

The first oxide semiconductor layer 10 is formed by, for example, an atomic layer deposition method (ALD method).

The gate electrode 12 is provided surrounding the first oxide semiconductor layer 10. The gate electrode 12 is provided around the first oxide semiconductor layer 10.

The gate electrode 12 is, for example, a metal, a metal compound, or a semiconductor. The gate electrode 12 is, for example, tungsten (W). The gate length of the gate electrode 12 is, for example, 20 nm or more and 100 nm or less. The gate length of the gate electrode 12 is the length of the gate electrode 12 in the third direction.

The gate insulating layer 14 is provided between the first oxide semiconductor layer 10 and the gate electrode 12. The gate insulating layer 14 is provided surrounding the first oxide semiconductor layer 10. The gate insulating layer 14 is provided at least between the third region 10c and the gate electrode 12.

The gate insulating layer 14 is, for example, an oxide or oxynitride. The gate insulating layer 14 is, for example, silicon oxide or aluminum oxide. The thickness of the gate insulating layer 14 is, for example, 2 nm or more and 10 nm or less.

An oxide layer (not shown) of a material different from that of the gate insulating layer 14 may be provided between the first oxide semiconductor layer 10 and the gate insulating layer 14.

The source electrode 16 is provided below the first oxide semiconductor layer 10. The source electrode 16 is provided below the first region 10a. The source electrode 16 is electrically connected to the first region 10a.

The source electrode 16 is, for example, a metal or a metal compound. The source electrode 16 is, for example, tungsten (W).

The drain electrode 18 is provided above the first oxide semiconductor layer 10. The drain electrode 18 is provided above the second region 10b. The drain electrode 18 is electrically connected to the second region 10b.

The drain electrode 18 is, for example, a metal or a metal compound. The source electrode 16 is, for example, tungsten (W).

The second oxide semiconductor layer 20 is provided between the first oxide semiconductor layer 10 and the source electrode 16. The second oxide semiconductor layer 20 is provided between the first region 10a and the source electrode 16. The second oxide semiconductor layer 20 is in contact with the first oxide semiconductor layer 10.

The second oxide semiconductor layer 20 is an oxide semiconductor. The second oxide semiconductor layer 20 is a metal oxide. The second oxide semiconductor layer 20 is amorphous, for example.

The second oxide semiconductor layer 20 contains indium (In), aluminum (Al), and zinc (Zn). The second oxide semiconductor layer 20 is an oxide containing indium (In), aluminum (Al), and zinc (Zn).

The atomic ratio of aluminum to the sum of indium, aluminum, and zinc in the second oxide semiconductor layer 20 is 8% or more and 23% or less. That is, the atomic ratio expressed by Al/(In+Al+Zn) of the second oxide semiconductor layer 20 is 8% or more and 23% or less.

The atomic ratio of indium to the sum of indium, aluminum, and zinc in the second oxide semiconductor layer 20 is 45% or less. That is, the atomic ratio expressed by In/(In+Al+Zn) of the second oxide semiconductor layer 20 is 45% or less.

The atomic ratio of indium to the sum of indium, aluminum, and zinc in the second oxide semiconductor layer 20 is, for example, 1% or more. That is, the atomic ratio expressed by In/(In+Al+Zn) of the second oxide semiconductor layer 20 is 1% or more.

The atomic ratio of the sum of indium, aluminum, and zinc in metal elements contained in the second oxide semiconductor layer 20 is, for example, 90% or more. The atomic ratio of the sum of indium, aluminum, and zinc in the elements except for oxygen contained in the second oxide semiconductor layer 20 is, for example, 90% or more. For example, in the second oxide semiconductor layer 20, there is no element except for oxygen having an atomic ratio larger than any one of indium, aluminum, and zinc.

The atomic ratio of each of gallium (Ga), tin (Sn), and titanium (Ti) in the metal elements contained in the second oxide semiconductor layer 20 is less than 10%, for example.

The third oxide semiconductor layer 22 is provided between the first oxide semiconductor layer 10 and the drain electrode 18. The third oxide semiconductor layer 22 is provided between the second region 10b and the drain electrode 18. The third oxide semiconductor layer 22 is in contact with the first oxide semiconductor layer 10.

The third oxide semiconductor layer 22 is an oxide semiconductor. The third oxide semiconductor layer 22 is a metal oxide. The third oxide semiconductor layer 22 is amorphous, for example.

The third oxide semiconductor layer 22 contains indium (In), aluminum (Al), and zinc (Zn). The third oxide semiconductor layer 22 is an oxide containing indium (In), aluminum (Al), and zinc (Zn).

The atomic ratio of aluminum to the sum of indium, aluminum, and zinc in the third oxide semiconductor layer 22 is 8% or more and 23% or less. That is, the atomic ratio expressed by Al/(In+Al+Zn) is 8% or more and 23% or less.

The atomic ratio of indium to the sum of indium, aluminum, and zinc in the third oxide semiconductor layer 22 is 45% or less. That is, the atomic ratio expressed by In/(In+Al+Zn) of the third oxide semiconductor layer 22 is 45% or less.

The atomic ratio of indium to the sum of indium, aluminum, and zinc in the third oxide semiconductor layer 22 is, for example, 1% or more. That is, the atomic ratio expressed by In/(In+Al+Zn) of the third oxide semiconductor layer 22 is 1% or more.

The atomic ratio of the sum of indium, aluminum, and zinc in metal elements contained in the third oxide semiconductor layer 22 is, for example, 90% or more. The atomic ratio of the sum of indium, aluminum, and zinc in the elements except for oxygen contained in the third oxide semiconductor layer 22 is, for example, 90% or more. For example, in the third oxide semiconductor layer 22, there is no element except for oxygen having an atomic ratio larger than any one of indium, aluminum, and zinc.

The atomic ratio of each of gallium (Ga), tin (Sn), and titanium (Ti) in the metal elements contained in the third oxide semiconductor layer 22 is less than 10%, for example.

The distance between the gate electrode 12 and the source electrode 16 in the channel length direction (d5 in FIG. 8) and the distance between the gate electrode 12 and the drain electrode 18 in the channel length direction (d6 in FIG. 8) are each referred to as a gate offset distance. The gate offset distance d5 is, for example, 30 nm or more. The gate offset distance d6 is, for example, 30 nm or more.

The interlayer insulating layer 32 is provided around the gate electrode 12, the source electrode 16, and the drain electrode 18. The interlayer insulating layer 32 is, for example, an oxide, a nitride, or an oxynitride. The interlayer insulating layer 32 is, for example, silicon oxide, silicon nitride, or silicon oxynitride.

Figure 10:
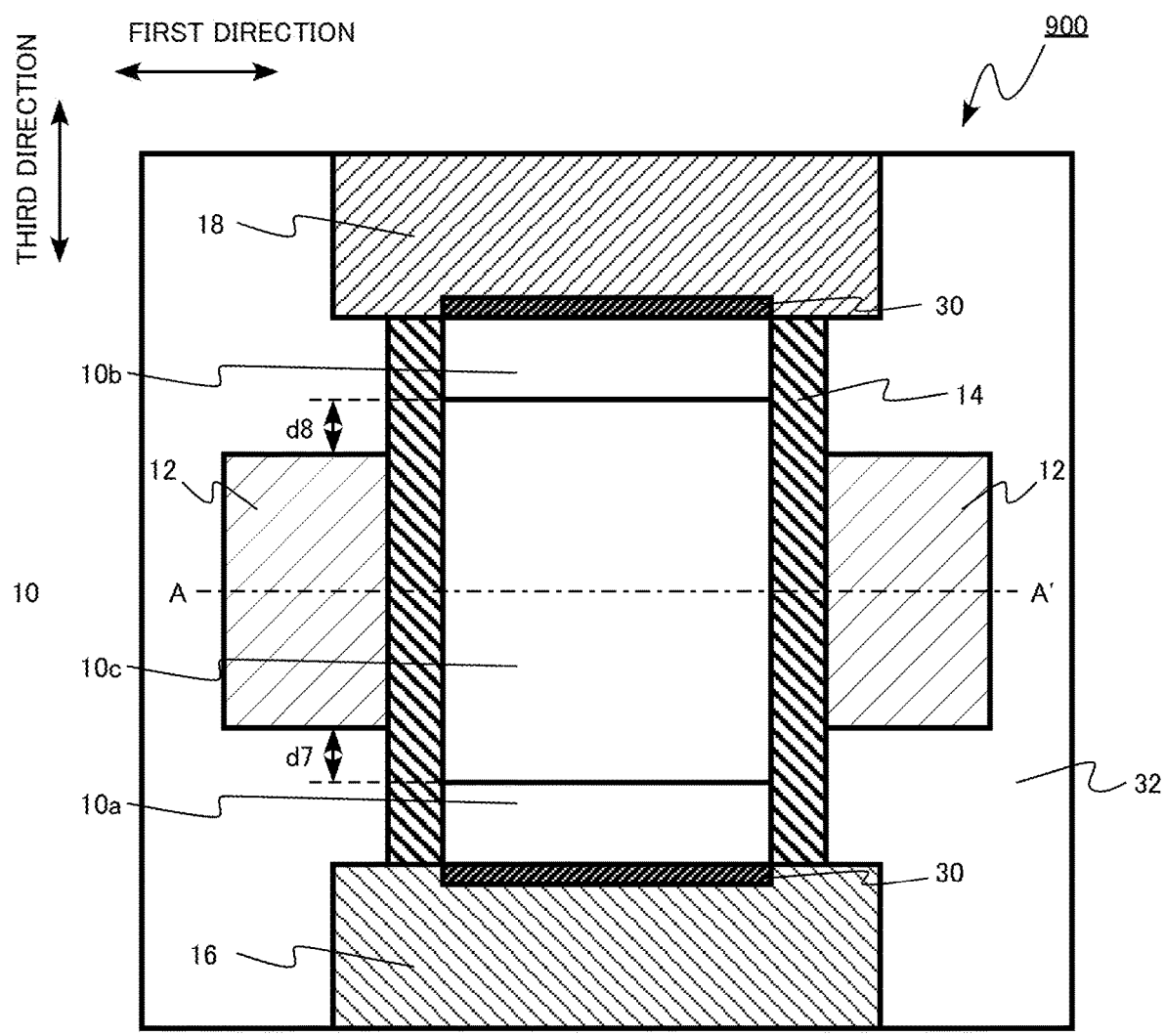
FIG. 10 is a schematic sectional view of a semiconductor device according to a comparative example.

FIG. 10 is a schematic sectional view of a semiconductor device of a comparative example. The semiconductor device of the comparative example is a transistor 900. The transistor 900 is an oxide semiconductor transistor in which a channel is formed in an oxide semiconductor. The transistor 900 is a so-called SGT with a gate electrode provided surrounding an oxide semiconductor layer in which a channel is formed. The transistor 900 is a so-called vertical transistor.

The transistor 900 differs from the transistor 300 of the fourth embodiment in not including the second oxide semiconductor layer 20 or the third oxide semiconductor layer 22. Transistor 900 differs from the transistor 300 of the fourth embodiment in including the metal oxide layer 30.

The metal oxide layer 30 is formed by heat treatment applied after the formation of the source electrode 16 and the drain electrode 18. Specifically, oxygen contained in the first oxide semiconductor layer 10 is absorbed by the source electrode 16 and the drain electrode 18, and the metal constituting each of the source electrode 16 and the drain electrode 18 is oxidized, to form the metal oxide layer 30.

The formation of the metal oxide layer 30 increases the contact resistance between the first oxide semiconductor layer 10 and the source electrode 16 and the contact resistance between the first oxide semiconductor layer 10 and the drain electrode 18. This causes a problem of an increase in the parasitic resistance of the transistor 900 and a decrease in the on-current of the transistor 900.

The first region 10*a* and the second region 10*b* of the first oxide semiconductor layer 10 are formed by absorbing oxygen in the source electrode 16 and the drain electrode 18 by heat treatment applied after the formation of the source electrode 16 and the drain electrode 18. That is, oxygen contained in the first oxide semiconductor layer 10 is absorbed by the source electrode 16 and the drain electrode 18, whereby oxygen-vacancy is generated in the first oxide semiconductor layer 10. The generation of the oxygen-vacancy leads to the formation of the first region 10*a* and the second region 10*b* having high n-type carrier concentration and low resistance.

When the amounts of oxygen absorbed by the source electrode 16 and the drain electrode 18 are small, the amounts of elongation of the first region 10*a* and the second region 10*b* in the channel length direction decrease. Thereby, the distance (d7 in FIG. 10) between the gate electrode 12 and the first region 10*a* increases. Further, the distance (d8 in FIG. 10) between the gate electrode 12 and the second region 10*b* increases.

The increase in the separation distance d7 and the separation distance d8 leads to an increase in the parasitic resistance of the transistor 900. This thus causes the problem of the decrease in the on-current of the transistor 900.

The transistor 300 of the fourth embodiment includes the second oxide semiconductor layer 20 between the first oxide semiconductor layer 10 and the source electrode 16, and includes the third oxide semiconductor layer 22 between the first oxide semiconductor layer 10 and the drain electrode 18. The second oxide semiconductor layer 20 and the third oxide semiconductor layer 22 have low oxygen permeability. The provision of the second oxide semiconductor layer 20 and the third oxide semiconductor layer 22 prevents the oxidation of the source electrode 16 and the drain electrode 18.

Hence an increase in the contact resistance between the first oxide semiconductor layer 10 and the source electrode 16 and an increase in the contact resistance between the first oxide semiconductor layer 10 and the drain electrode 18 are prevented. Hence the reduction in the on-current of the transistor 300 is prevented.

The transistor 300 of the fourth embodiment includes the second oxide semiconductor layer 20 between the first oxide semiconductor layer 10 and the source electrode 16, and includes the third oxide semiconductor layer 22 between the first oxide semiconductor layer 10 and the drain electrode 18. The second oxide semiconductor layer 20 and the third oxide semiconductor layer 22 have high oxygen absorption capacity. The provision of the second oxide semiconductor layer 20 and the third oxide semiconductor layer 22 increases the amounts of elongation of the first region 10*a* and the second region 10*b* in the channel length direction (third direction). Hence the distance between the gate electrode 12 and the first region 10*a* is reduced. Further, the distance between the gate electrode 12 and the second region 10*b* is reduced.

Due to the reduction in the distance, the parasitic resistance of the transistor 300 is reduced. This prevents a reduction in the on-current of the transistor 300 of the fourth embodiment.

As described above, according to the fourth embodiment, as in the first embodiment, an oxide semiconductor transistor having high heat resistance, in which an increase in contact resistance after heat treatment is prevented, is achieved. As in the first embodiment, an oxide semiconductor transistor having a low parasitic resistance is achieved. Further, according to the fourth embodiment, with the transistor being the SGT, transistors can be arranged at a high density per unit area.

Fifth Embodiment

A semiconductor memory device of a fifth embodiment includes: a first wiring extending in a first direction; a second wiring extending in a second direction intersecting the first direction; and a memory cell including a first oxide semiconductor layer including a first region, a second region, and a third region between the first region and the second region, the first region being electrically connected to the first wiring, a gate electrode surrounding the first oxide semiconductor layer and electrically connected to the second wiring, a gate insulating layer provided between the first oxide semiconductor layer and the gate electrode, a capacitor electrically connected to the second region, and a second oxide semiconductor layer provided in at least one of a position between the first region and the first wiring and a position between the second region and the capacitor and containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less. The memory cell includes a capacitor electrically connected to the second region of the semiconductor device of the fourth embodiment. Hereinafter, a part of the description of contents overlapping with those of the first to fourth embodiments will be omitted.

The semiconductor memory device of the fifth embodiment is a semiconductor memory 400. The semiconductor memory device of the fifth embodiment is dynamic random-access memory (DRAM). The semiconductor memory 400 uses the transistor 300 of the fourth embodiment as a switching transistor of a memory cell of the DRAM.

Figure 11:
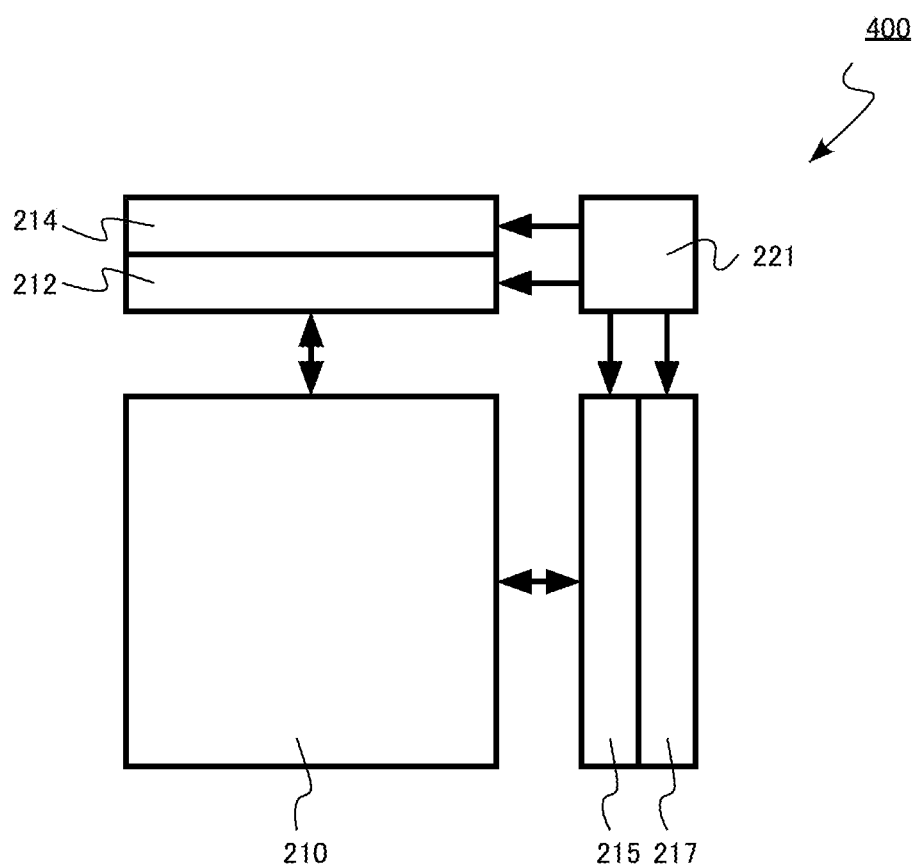
FIG. 11 is a block diagram of a semiconductor memory device according to a fifth embodiment.

FIG. 11 is a block diagram of the semiconductor memory device of the fifth embodiment.

As shown in FIG. 11, the semiconductor memory 400 includes a memory cell array 210, a word-line driver circuit 212, a row decoder circuit 214, a sense amplifier circuit 215, a column decoder circuit 217, and a control circuit 221.

Figure 12:
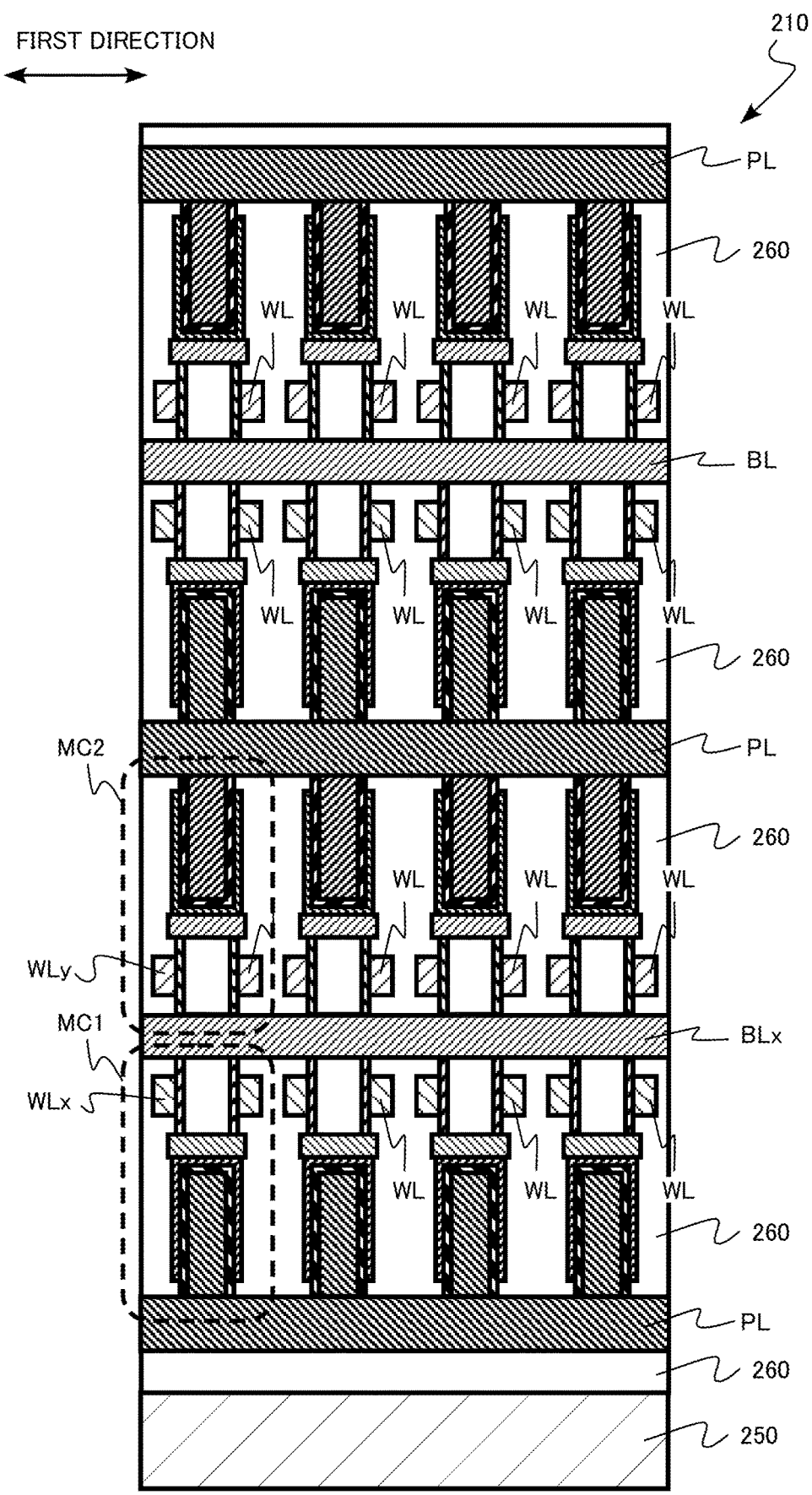
FIG. 12 is a schematic sectional view of a memory cell array of the semiconductor memory device of the fifth embodiment.
Figure 13:
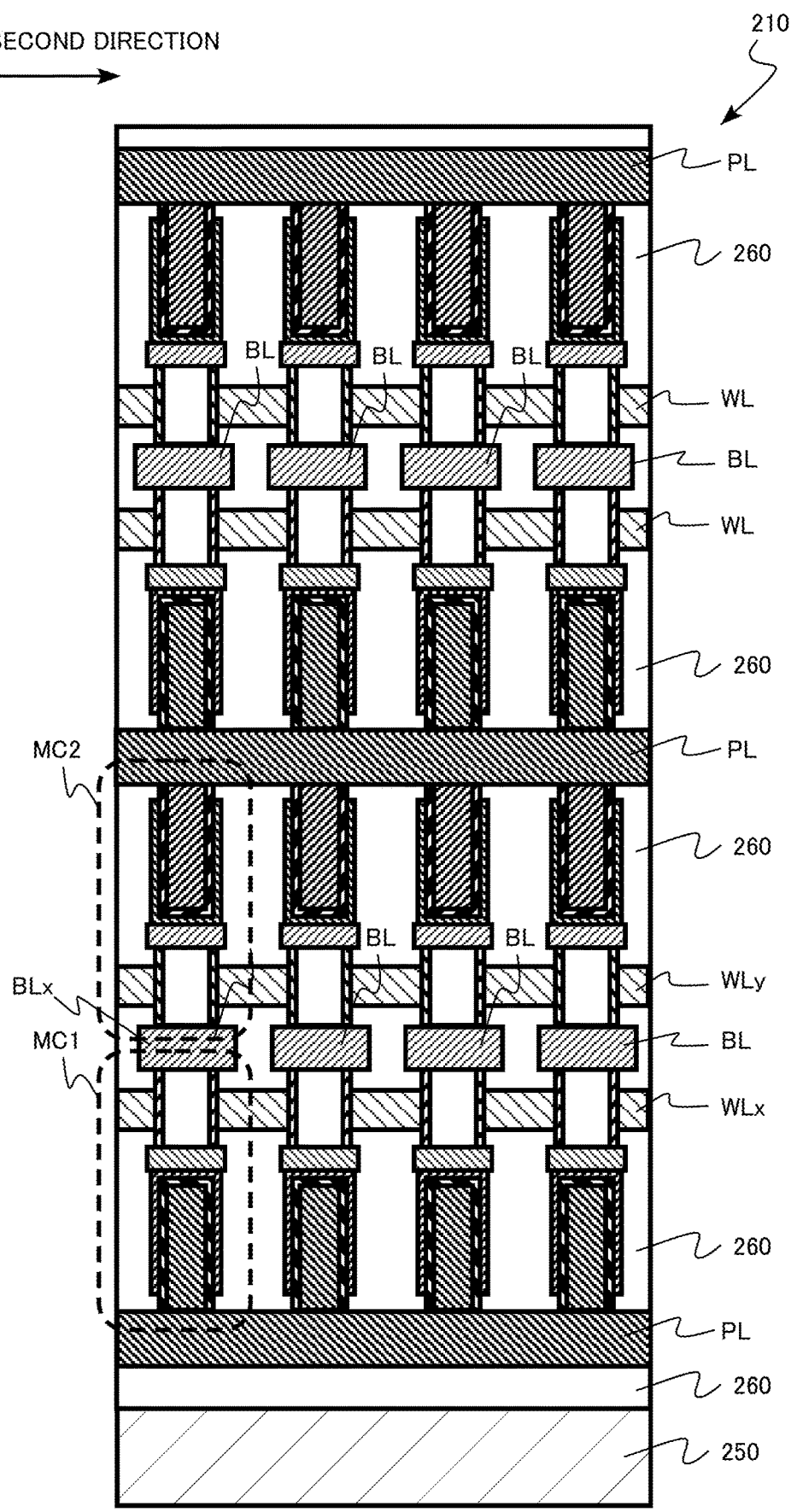
FIG. 13 is a schematic sectional view of the memory cell array of the semiconductor memory device of the fifth embodiment.

FIGS. 12 and 13 are schematic sectional views of the memory cell array in the semiconductor memory device of the fifth embodiment. FIG. 12 is a sectional view of a plane including the first direction and the third direction, and FIG. 13 is a sectional view of a plane including the second direction and the third direction. The first direction and the second direction intersect each other. The first direction and the second direction are, for example, perpendicular to each other. The third direction is a direction perpendicular to the first direction and the second direction. The third direction is, for example, a direction perpendicular to a substrate.

The memory cell array 210 of the fifth embodiment has a three-dimensional structure in which the memory cells are arranged three-dimensionally. In each of FIGS. 12 and 13, a region surrounded by a broken line represents one memory cell.

The memory cell array 210 includes a silicon substrate 250.

The memory cell array 210 includes, for example, a plurality of bit lines BL and a plurality of word lines WL on the silicon substrate 250. The bit line BL extends in the first direction. The word line WL extends in the second direction.

The bit line BL and the word line WL intersect at right angle, for example. The memory cell is disposed in an area where the bit line BL and the word line WL intersect each other. The memory cell includes a first memory cell MC1 and a second memory cell MC2. The first memory cell MC1 and the second memory cell MC2 are examples of the memory cell.

A bit line BL connected to the first memory cell MC1 and the second memory cell MC2 is a bit line BLx. The bit line BLx is an example of the first wiring. A word line WL connected to the first memory cell MC1 is a word line WLx. The word line WLx is an example of the second wiring.

A word line WL connected to the second memory cell MC2 is a word line WLy. The word line WLx is provided on one side of the bit line BLx. The word line WLy is provided on the other side of the bit line BLx.

The memory cell array 210 has a plurality of plate electrode lines PL. The plate electrode line PL is connected to the plate electrode 72 of each memory cell.

The memory cell array 210 includes an interlayer insulating layer 260 for electrical separation of each wiring and each electrode.

The plurality of word lines WL are electrically connected to the row decoder circuit 214. The plurality of bit lines BL are electrically connected to the sense amplifier circuit 215.

The row decoder circuit 214 has a function of selecting a word line WL in accordance with an input row address signal. The word-line driver circuit 212 has a function of applying a predetermined voltage to the word line WL selected by the row decoder circuit 214.

The column decoder circuit 217 has a function of selecting a bit line BL in accordance with an input column address signal. The sense amplifier circuit 215 has a function of applying a predetermined voltage to the bit line BL selected by the column decoder circuit 217. The sense amplifier circuit 215 also has a function of detecting and amplifying the electric potential of the bit line BL.

The control circuit 221 has functions for controlling the word-line driver circuit 212, the row decoder circuit 214, the sense amplifier circuit 215, the column decoder circuit 217, and other circuits (not shown).

Circuits such as the word-line driver circuit 212, the row decoder circuit 214, the sense amplifier circuit 215, the column decoder circuit 217, and the control circuit 221 are made of, for example, transistors and wiring layers (not shown). The transistor is formed using, for example, the silicon substrate 250.

The bit line BL and the word line WL are, for example, metal. The bit line BL and the word line WL are, for example, titanium nitride, tungsten, or a stacked structure of titanium nitride and tungsten.

Figure 14:
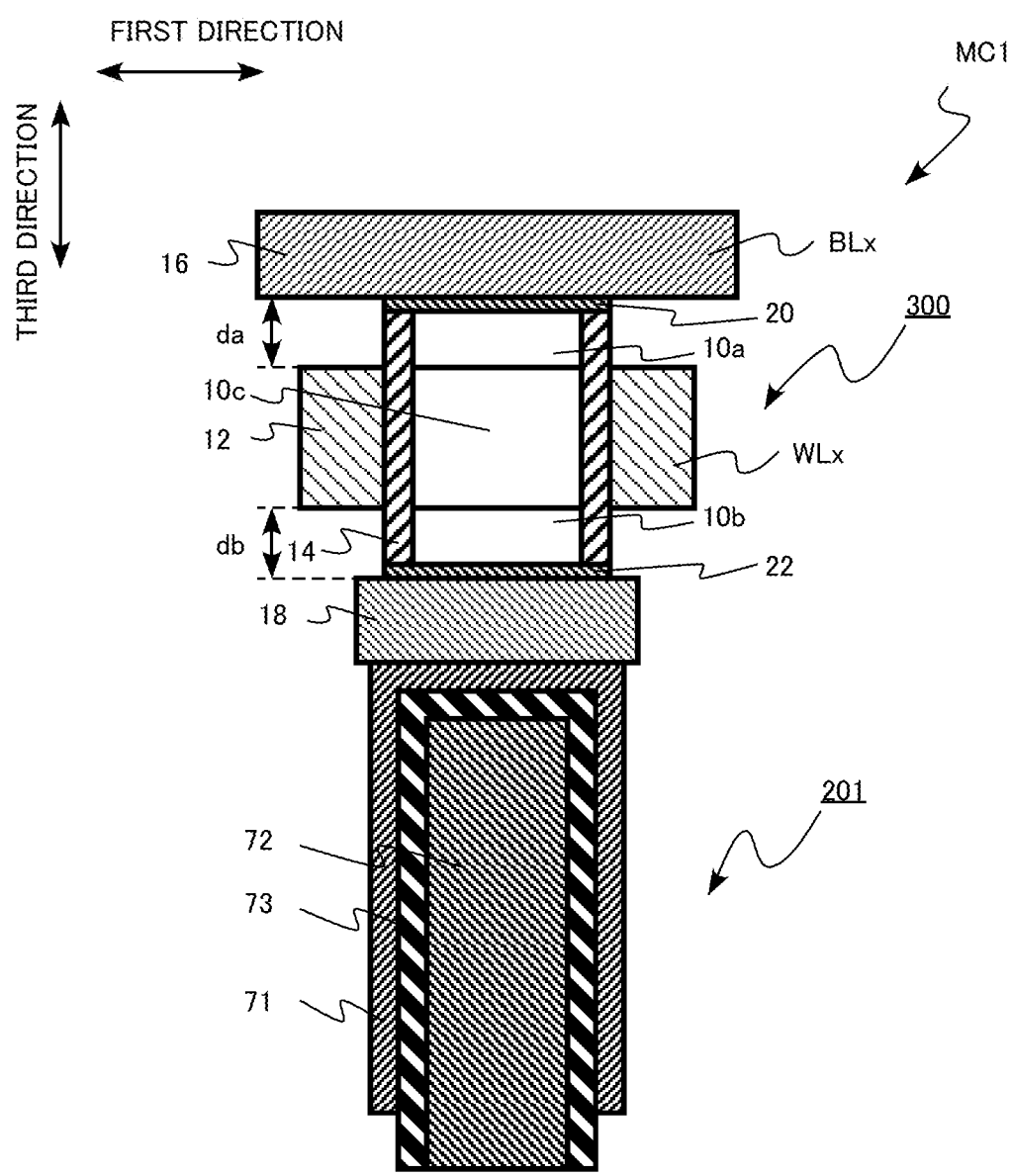
FIG. 14 is a schematic sectional view of a first memory cell of the semiconductor memory device according to the fifth embodiment.
Figure 15:
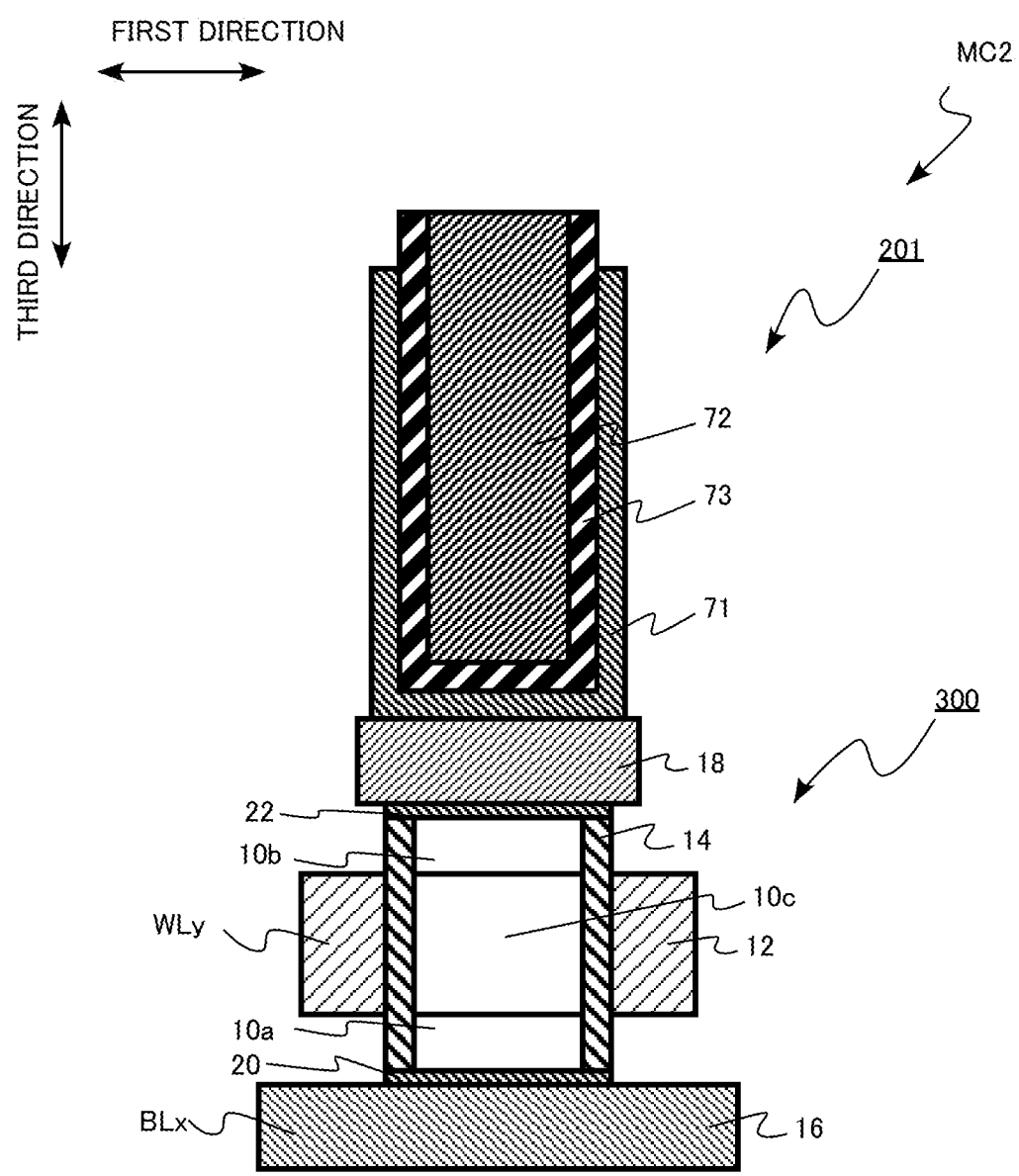
FIG. 15 is a schematic sectional view of a second memory cell of the semiconductor memory device according to the fifth embodiment.

FIG. 14 is a schematic sectional view of the first memory cell in the semiconductor memory device of the fifth embodiment. FIG. 15 is a schematic sectional view of the second memory cell in the semiconductor memory device of the fifth embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a structure in which the first memory cell MC1 is inverted vertically. The first memory cell MC1 and the second memory cell MC2 each includes the transistor 300 and a capacitor 201.

The transistor 300 includes a first oxide semiconductor layer 10, a gate electrode 12, a gate insulating layer 14, a source electrode 16, a drain electrode 18, a second oxide semiconductor layer 20, and a third oxide semiconductor layer 22. The source electrode 16 is an example of the first electrode. The drain electrode 18 is an example of the second electrode. The transistor 300 has the same configuration as the transistor 300 of the fourth embodiment.

The first oxide semiconductor layer 10 has a first region 10a, a second region 10b, and a third region 10c.

The capacitor 201 includes a cell electrode 71, the plate electrode 72, and a capacitor insulating film 73. The cell electrode 71 and the plate electrode 72 are, for example, titanium nitride. The capacitor insulating film 73 has, for example, a stacked structure of zirconium oxide, aluminum oxide, and zirconium oxide.

The capacitor 201 is electrically connected to one end of each of the first oxide semiconductor layer 10 of the first memory cell MC1 and the second memory cell MC2. The cell electrode 71 of the capacitor 201 is connected to the drain electrode 18. The plate electrode 72 is connected to the plate electrode line PL.

The source electrode 16 is connected to the bit line BL. The gate electrode 12 is connected to the word line WL.

FIGS. 12, 13, 14, and 15 each show a case where the bit line BL and the source electrode 16, as well as the word line WL and the gate electrode 12, are simultaneously formed using the same material. The bit line BL and the source electrode 16, as well as the word line WL and the gate electrode 12, may be separately formed using different materials.

The bit line BLx is electrically connected to the end (the other end) of the first memory cell MC1 opposite to the end to which the capacitor 201 of the first oxide semiconductor layer 10 is connected. The bit line BLx is electrically connected to the end (the other end) of the second memory cell MC2 opposite to the end to which the capacitor 201 of the first oxide semiconductor layer 10 is connected.

The word line WLx is electrically connected to the gate electrode 12 of the first memory cell MC1. The word line WLy is electrically connected to the gate electrode 12 of the second memory cell MC2.

For preventing malfunction of the semiconductor memory 400 due to coupling between the word line WL and the bit line BL, the distance (da in FIG. 14) between the word line WL and the bit line BL is preferably long. A distance da between the word line WL and the bit line BL is preferably 30 nm or more.

For preventing malfunction of the semiconductor memory 400 due to coupling between the word line WL and the capacitor 201, the distance between the word line WL and the capacitor 201 is preferably long. Therefore, the distance between the word line WL and the drain electrode 18 (db in FIG. 14) is preferably long. The distance db between the word line WL and the drain electrode 18 is preferably 30 nm or more.

The transistor 300 includes the second oxide semiconductor layer 20 between the first oxide semiconductor layer 10 and the source electrode 16, and includes the third oxide semiconductor layer 22 between the first oxide semiconductor layer 10 and the drain electrode 18. The provision of the second oxide semiconductor layer 20 and the third oxide semiconductor layer 22 increases the amounts of elongation of the first region 10a and the second region 10b in the channel length direction (third direction).

Therefore, even when the distance da between the word line WL and the bit line BL is increased, the parasitic resistance of the transistor 300 can be reduced. Further, even when the distance db between the word line WL and the drain electrode 18 is increased, the parasitic resistance of the transistor 300 can be reduced.

When the oxide semiconductor transistor is used as the switching transistor of the memory cell of the DRAM, a high-temperature and long-time heat treatment is applied after the formation of the transistor. The heat treatment is, for example, a heat treatment for capacitor formation. Therefore, the oxidation of a metal electrode in contact with the oxide semiconductor layer in which the channel is formed proceeds easily. When the oxidation of the metal electrode proceeds and the metal oxide layer is formed, the contact resistance increases, and this becomes a problem.

The transistor 300 includes the second oxide semiconductor layer 20 between the first oxide semiconductor layer 10 and the source electrode 16, and includes the third oxide semiconductor layer 22 between the first oxide semiconductor layer 10 and the drain electrode 18. The provision of the second oxide semiconductor layer 20 and the third oxide semiconductor layer 22 prevents the oxidation of the source electrode 16 and the drain electrode 18.

Therefore, even when the high-temperature and long-time heat treatment is applied after the formation of the transistor, an increase in the contact resistance between the first oxide semiconductor layer 10 and the source electrode 16 and an increase in the contact resistance between the first oxide semiconductor layer 10 and the drain electrode 18 are prevented. Hence the reduction in the on-current of the transistor 300 is prevented.

According to the fifth embodiment, by using the transistor 300 of the fifth embodiment as the switching transistor of the DRAM, a semiconductor memory having improved memory characteristics is achieved.

Sixth Embodiment

A semiconductor device of a sixth embodiment includes: a first oxide semiconductor layer; a conductive layer, and a second oxide semiconductor layer provided between the first oxide semiconductor layer and the conductive layer and containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less. The semiconductor device of the sixth embodiment differs from the first embodiment in that a second oxide semiconductor layer is provided between the first oxide semiconductor layer and the conductive layer. Hereinafter, a part of the description of contents overlapping with those of the first embodiment will be omitted.

Figure 16:
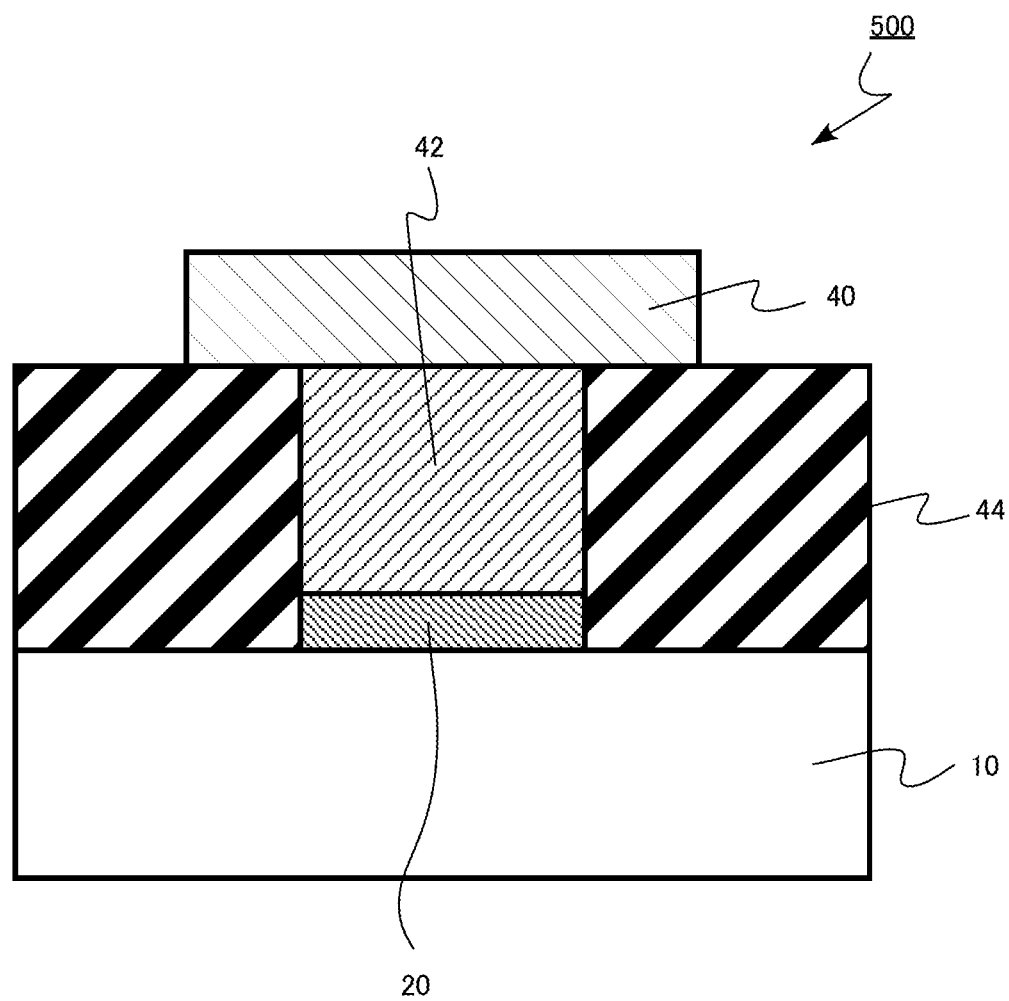
FIG. 16 is a schematic sectional view of a semiconductor device according to a sixth embodiment.

FIG. 16 is a schematic sectional view of the semiconductor device of the sixth embodiment.

The semiconductor device of the sixth embodiment includes a contact structure 500. The contact structure 500 includes a first oxide semiconductor layer 10, a second oxide semiconductor layer 20, a wiring layer 40, a contact plug 42, and an interlayer insulating layer 44. The contact plug 42 is an example of the conductive layer.

The first oxide semiconductor layer 10 is an oxide semiconductor. The first oxide semiconductor layer 10 is a metal oxide. The first oxide semiconductor layer 10 is amorphous, for example.

The first oxide semiconductor layer 10 contains, for example, indium (In), gallium (Ga), and zinc (Zn). The atomic ratio of the sum of indium, gallium, and zinc in metal elements contained in the first oxide semiconductor layer 10 is, for example, 90% or more. The atomic ratio of the sum of indium, gallium, and zinc in elements except for oxygen contained in the first oxide semiconductor layer 10 is, for example, 90% or more. For example, in the first oxide semiconductor layer 10, there is no element except for oxygen having an atomic ratio larger than any one of indium, gallium, and zinc.

The wiring layer 40 is, for example, a metal or a metal compound.

The contact plug 42 is provided between the first oxide semiconductor layer 10 and the wiring layer 40. The contact plug 42 includes a metal. The contact plug 42 is, for example, a metal or a metal compound. The contact plug 42 is, for example, tungsten (W).

The second oxide semiconductor layer 20 is provided between the first oxide semiconductor layer 10 and the contact plug 42. The second oxide semiconductor layer 20 is an oxide semiconductor. The second oxide semiconductor layer 20 is a metal oxide. The second oxide semiconductor layer 20 is amorphous, for example.

The second oxide semiconductor layer 20 contains indium (In), aluminum (Al), and zinc (Zn). The second oxide semiconductor layer 20 is an oxide containing indium (In), aluminum (Al), and zinc (Zn).

The atomic ratio of aluminum to the sum of indium, aluminum, and zinc in the second oxide semiconductor layer 20 is 8% or more and 23% or less. That is, the atomic ratio expressed by Al/(In+Al+Zn) of the second oxide semiconductor layer 20 is 8% or more and 23% or less.

The atomic ratio of indium to the sum of indium, aluminum, and zinc in the second oxide semiconductor layer 20 is 45% or less. That is, the atomic ratio expressed by In/(In+Al+Zn) of the second oxide semiconductor layer 20 is 45% or less.

The atomic ratio of indium to the sum of indium, aluminum, and zinc in the second oxide semiconductor layer 20 is, for example, 1% or more. That is, the atomic ratio expressed by In/(In+Al+Zn) of the second oxide semiconductor layer 20 is 1% or more.

The atomic ratio of the sum of indium, aluminum, and zinc in metal elements contained in the second oxide semiconductor layer 20 is, for example, 90% or more. The atomic ratio of the sum of indium, aluminum, and zinc in the elements except for oxygen contained in the second oxide semiconductor layer 20 is, for example, 90% or more. For example, in the second oxide semiconductor layer 20, there is no element except for oxygen having an atomic ratio larger than any one of indium, aluminum, and zinc.

The atomic ratio of each of gallium (Ga), tin (Sn), and titanium (Ti) in the metal elements contained in the second oxide semiconductor layer 20 is less than 10%, for example.

The interlayer insulating layer 44 is provided between the first oxide semiconductor layer 10 and the wiring layer 40.

The interlayer insulating layer 44 is, for example, silicon oxide, silicon nitride, or silicon oxynitride.

When the contact structure 500 does not include the second oxide semiconductor layer 20, the contact plug 42 is oxidized by a heat treatment applied after the formation of the contact structure 500. That is, oxygen contained in the first oxide semiconductor layer 10 is absorbed by the contact plug 42 to form a metal oxide layer in which the metal constituting the contact plug 42 is oxidized.

The formation of the metal oxide layer between the first oxide semiconductor layer 10 and the contact plug 42 increases the contact resistance between the first oxide semiconductor layer 10 and the contact plug 42 is increased.

The contact structure 500 includes the second oxide semiconductor layer 20 between the first oxide semiconductor layer 10 and the contact plug 42. The provision of the second oxide semiconductor layer 20 prevents the oxidation of the contact plug 42. This prevents an increase in the contact resistance between the first oxide semiconductor layer 10 and the contact plug 42.

As described above, according to the sixth embodiment, a semiconductor device having high heat resistance, in which an increase in contact resistance after heat treatment is prevented, is achieved.

In the first to fifth embodiments, the transistor provided with both the second oxide semiconductor layer 20 and the third oxide semiconductor layer 22 has been described as an example, but the transistor provided with only either the second oxide semiconductor layer 20 or the third oxide semiconductor layer 22 may be used.

In the first to fifth embodiments, the case where the first oxide semiconductor layer 10 is a metal oxide containing indium and gallium has been described as an example, but other metal oxides may be applied to the first oxide semiconductor layer 10.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first oxide semiconductor layer including a first region, a second region, and a third region between the first region and the second region;
    a gate electrode;
    a gate insulating layer provided between the third region and the gate electrode;
    a first electrode electrically connected to the first region;
    a second electrode electrically connected to the second region;
    a second oxide semiconductor layer provided in one of a position between the first region and the first electrode and a position between the second region and the second electrode, the second oxide semiconductor layer containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less; and
    a third oxide semiconductor layer provided in another of the position between the first region and the first electrode and the position between the second region and the second electrode, the third oxide semiconductor layer containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less.

2. The semiconductor device according to claim 1, wherein the first oxide semiconductor layer contains indium (In), gallium (Ga), and zinc (Zn).

3. The semiconductor device according to claim 1, wherein the first oxide semiconductor layer contains indium (In), aluminum (Al), and zinc (Zn), an atomic ratio of aluminum to a sum of indium, aluminum, and zinc is 8% or more and 23% or less, and an atomic ratio of indium to the sum of indium, aluminum, and zinc is 70% or less.

4. The semiconductor device according to claim 1, wherein the gate electrode surrounds the first oxide semiconductor layer.

5. The semiconductor device according to claim 1, wherein the atomic ratio of indium to the sum of indium, aluminum, and zinc in the second oxide semiconductor layer is 35% or more.

6. The semiconductor device according to claim 1, wherein the first region and the second region are n-type semiconductors.

7. The semiconductor device according to claim 1,
    wherein when the second oxide semiconductor layer is provided between the first region and the first electrode, and a distance in a direction from the first electrode towards the second electrode between the gate electrode and the first electrode is 30 nm or more, and/or
    wherein the second oxide semiconductor layer is provided between the second region and the second electrode, and a distance in the direction between the gate electrode and the second electrode is 30 nm or more.

8. A semiconductor memory device comprising:
    a first wiring extending in a first direction;
    a second wiring extending in a second direction intersecting the first direction; and
    a memory cell including
    a first oxide semiconductor layer including a first region, a second region, and a third region between the first region and the second region, the first region being electrically connected to the first wiring,
    a gate electrode surrounding the first oxide semiconductor layer and electrically connected to the second wiring,
    a gate insulating layer provided between the first oxide semiconductor layer and the gate electrode,
    a capacitor electrically connected to the second region,
    a second oxide semiconductor layer provided in one of a position between the first region and the first wiring and a position between the second region and the capacitor and containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less, and
    a third oxide semiconductor layer provided in another of the position between the first region and the first wiring and the position between the second region and the capacitor and containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less.

9. The semiconductor memory device according to claim 8, wherein the first oxide semiconductor layer contains indium (In), gallium (Ga), and zinc (Zn).

10. The semiconductor memory device according to claim 8, wherein the first oxide semiconductor layer contains indium (In), aluminum (Al), and zinc (Zn), an atomic ratio of aluminum to a sum of indium, aluminum, and zinc is 8% or more and 23% or less, and an atomic ratio of indium to the sum of indium, aluminum, and zinc is 70% or less.

11. The semiconductor memory device according to claim 8, wherein the atomic ratio of indium to the sum of indium, aluminum, and zinc in the second oxide semiconductor layer is 35% or more.

12. The semiconductor memory device according to claim 8, wherein the first region and the second region are n-type semiconductors.

13. The semiconductor memory device according to claim 8, wherein the second oxide semiconductor layer is provided between the first region and the first wiring, and a distance between the gate electrode and the first wiring is 30 nm or more.

14. A semiconductor device comprising:
a first oxide semiconductor layer;
a conductive layer, and
a second oxide semiconductor layer provided between the first oxide semiconductor layer and the conductive layer and containing indium (In), aluminum (Al), and zinc (Zn), an atomic ratio of aluminum to a sum of indium, aluminum, and zinc being 8% or more and 23% or less, and an atomic ratio of indium to the sum of indium, aluminum, and zinc being 45% or less,
wherein the first oxide semiconductor layer contains indium (In), aluminum (Al), and zinc (Zn), an atomic ratio of aluminum to a sum of indium, aluminum, and zinc is 8% or more and 23% or less, and an atomic ratio of indium to the sum of indium, aluminum, and zinc is 70% or less.

15. The semiconductor device according to claim 14, wherein the first oxide semiconductor layer contains indium (In), gallium (Ga), and zinc (Zn).

16. The semiconductor device according to claim 14, wherein the atomic ratio of indium to the sum of indium, aluminum, and zinc in the second oxide semiconductor layer is 35% or more.

* * * * *